United States Patent
Fukunaga

(10) Patent No.: US 11,005,497 B2
(45) Date of Patent: May 11, 2021

(54) INFORMATION PROCESSING DEVICE, INFORMATION PROCESSING METHOD, AND PROGRAM

(71) Applicant: Sony Semiconductor Solutions Corporation, Kanagawa (JP)

(72) Inventor: Masatsugu Fukunaga, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 28 days.

(21) Appl. No.: 16/327,514

(22) PCT Filed: Oct. 26, 2017

(86) PCT No.: PCT/JP2017/038735
§ 371 (c)(1),
(2) Date: Feb. 22, 2019

(87) PCT Pub. No.: WO2018/100934
PCT Pub. Date: Jun. 7, 2018

(65) Prior Publication Data
US 2019/0173950 A1     Jun. 6, 2019

(30) Foreign Application Priority Data

Dec. 1, 2016    (JP) .............................. JP2016-233846

(51) Int. Cl.
*H03M 7/30*      (2006.01)
*H04L 29/08*      (2006.01)
(Continued)

(52) U.S. Cl.
CPC ................ *H03M 7/60* (2013.01); *G06F 7/58* (2013.01); *G06F 12/00* (2013.01); *G06F 17/16* (2013.01);
(Continued)

(58) Field of Classification Search
CPC ............. H03M 13/616; H03M 13/373; H03M 13/3761; H03M 13/1515; H03M 13/116;
(Continued)

(56) References Cited

U.S. PATENT DOCUMENTS

| 2005/0207577 A1* | 9/2005 | England ............. H04N 21/4367 380/213 |
| 2009/0103716 A1* | 4/2009 | Shirai ..................... H04L 9/002 380/28 |

(Continued)

FOREIGN PATENT DOCUMENTS

| JP | 2013-145954 A | 7/2013 |
| JP | 2014-036436 A | 2/2014 |

(Continued)

*Primary Examiner* — Linh V Nguyen
(74) *Attorney, Agent, or Firm* — Michael Best & Friedrich LLP

(57) ABSTRACT

[Object] To achieve both continuity of the system running and reduction of the running cost under a situation in which a storage region on a network is used as a saving destination of various kinds of data.

[Solution] Provided is a an information processing device including: a signal processing unit that encodes a first signal including one or more non-zero components based on first data and one or more zero components into a second signal having a shorter signal length than a signal length of the first signal on the basis of a matrix generated in accordance with a predetermined condition; a data generation unit that generates one or more pieces of second data by associating (Continued)

information indicating positions of signal elements in the second signal with the signal elements in the second signal; and a transmission unit that transmits each of the one or more generated pieces of second data to one or more devices connected via a network.

20 Claims, 20 Drawing Sheets

(51) Int. Cl.
*G06F 7/58* (2006.01)
*G06F 12/00* (2006.01)
*G06F 17/16* (2006.01)

(52) U.S. Cl.
CPC ........... *H03M 7/30* (2013.01); *H03M 7/3062* (2013.01); *H04L 67/1097* (2013.01)

(58) Field of Classification Search
CPC .. H03M 13/13; H03M 13/6516; H03M 1/002; H03M 13/154; H03M 1/70; H03M 7/3062; H03M 7/40; H03M 13/033; H03M 13/1168; H03M 13/6306; H03M 7/30; H03M 7/3059
See application file for complete search history.

(56) References Cited

U.S. PATENT DOCUMENTS

| | | | | |
|---|---|---|---|---|
| 2011/0270590 | A1* | 11/2011 | Aparin | H03F 1/3258 703/2 |
| 2014/0361770 | A1* | 12/2014 | Dannels | G01R 33/5611 324/309 |
| 2016/0094660 | A1* | 3/2016 | Reed | G06F 17/16 709/226 |
| 2017/0288704 | A1* | 10/2017 | Trusov | G06F 11/1012 |
| 2018/0107773 | A1* | 4/2018 | Fujisaki | G06F 30/23 |
| 2018/0129893 | A1* | 5/2018 | Son | G06N 3/0454 |
| 2018/0138925 | A1* | 5/2018 | Ikarashi | H03M 13/616 |
| 2018/0198466 | A1* | 7/2018 | Chiu | H03M 13/116 |
| 2018/0293134 | A1* | 10/2018 | Jin | H03M 13/3761 |
| 2018/0331869 | A1* | 11/2018 | Yoshizawa | H04L 27/2602 |
| 2019/0347162 | A1* | 11/2019 | Moussa | H03M 13/3761 |
| 2020/0021314 | A1* | 1/2020 | Medard | H03M 13/255 |

FOREIGN PATENT DOCUMENTS

| | | |
|---|---|---|
| JP | 5498875 B2 | 3/2014 |
| JP | 2015-220687 A | 12/2015 |

* cited by examiner

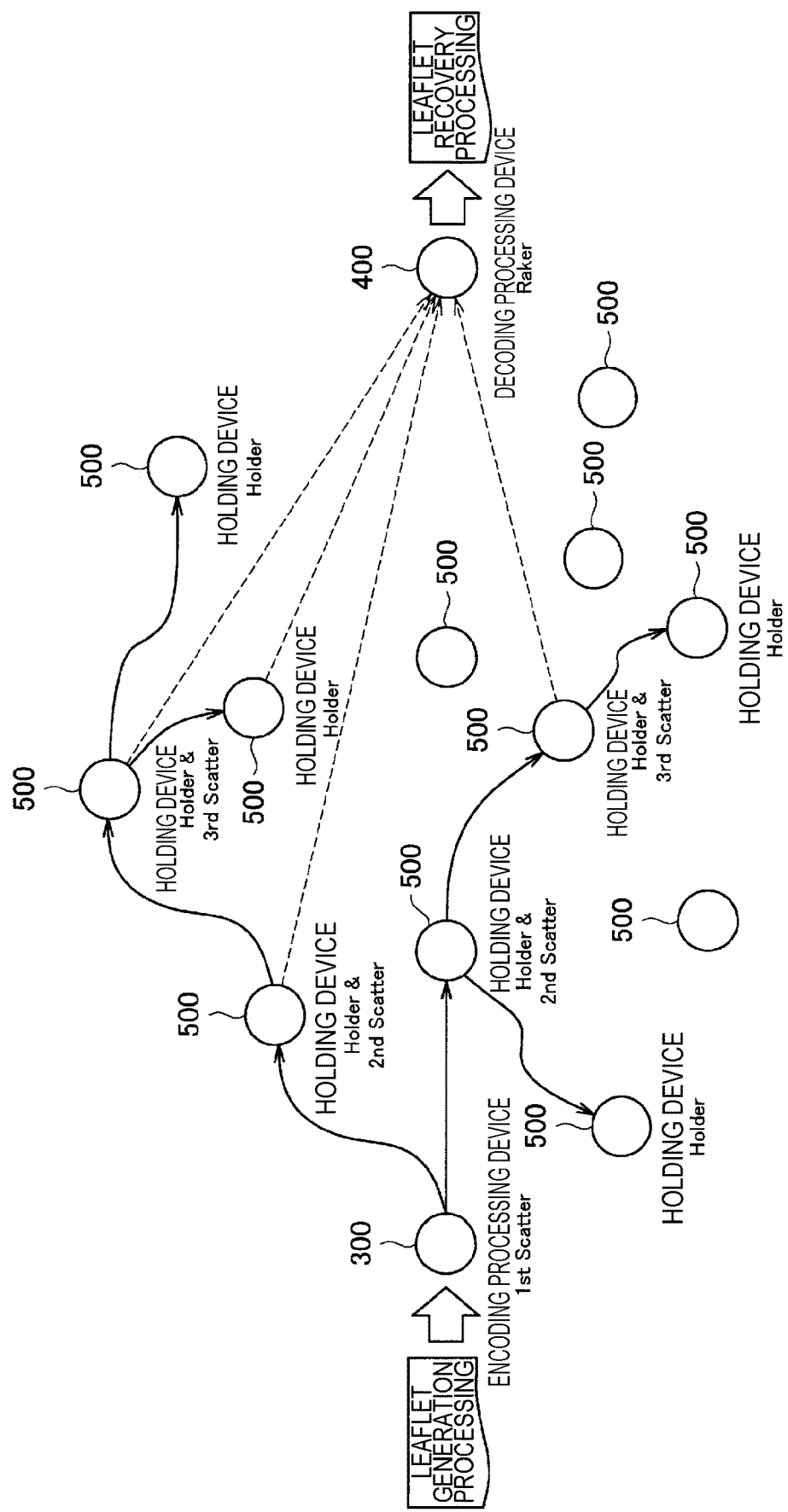

FIG. 3

$$A = \begin{bmatrix} [1\ 0\ 1\ 1\ 1\ 0\ 0\ 1\ 1\ 1\ 0\ 1\ 1\ 1\ 0\ 1] \\ [1\ 0\ 1\ 1\ 0\ 1\ 1\ 0\ 1\ 1\ 1\ 1\ 0\ 1\ 0\ 0] \\ [1\ 1\ 1\ 0\ 1\ 1\ 0\ 1\ 1\ 1\ 0\ 1\ 0\ 1\ 1\ 0] \\ [0\ 0\ 0\ 1\ 0\ 0\ 1\ 0\ 0\ 1\ 0\ 0\ 0\ 0\ 1\ 1] \\ [1\ 1\ 1\ 0\ 0\ 1\ 0\ 1\ 1\ 1\ 1\ 0\ 0\ 1\ 1\ 1] \\ [1\ 0\ 0\ 1\ 0\ 0\ 0\ 0\ 1\ 0\ 1\ 0\ 1\ 1\ 1\ 1] \\ [1\ 1\ 1\ 1\ 0\ 0\ 1\ 0\ 1\ 0\ 1\ 0\ 0\ 0\ 1\ 0] \\ [0\ 0\ 1\ 0\ 0\ 1\ 0\ 0\ 0\ 1\ 0\ 1\ 0\ 1\ 0\ 1] \\ [0\ 0\ 1\ 0\ 0\ 0\ 1\ 0\ 1\ 0\ 0\ 1\ 0\ 0\ 1\ 0] \end{bmatrix}$$

$$x = \begin{bmatrix} [13] \\ [\ 1] \\ [\ 0] \\ [\ 0] \\ [\ 5] \\ [\ 0] \\ [\ 1] \\ [\ 0] \\ [\ 0] \\ [19] \\ [\ 0] \\ [\ 0] \\ [\ 3] \\ [\ 4] \\ [\ 0] \\ [\ 0] \\ [\ 1] \end{bmatrix} \Rightarrow y = \begin{bmatrix} [19] \\ [14] \\ [15] \\ [\ 2] \\ [15] \\ [19] \\ [14] \\ [\ 1] \\ [14] \end{bmatrix}$$

FIG. 5

| PATTERN ID | N-TH 0 TO 2 ACTUAL RANDOM NUMBERS | | | | | | | |
|---|---|---|---|---|---|---|---|---|
| 0000001 | 0.12 | 0.11 | 1.11 | 1.22 | 0.513 | ... | 0.33 | ... |
| 0000002 | 0.99 | 1.112 | 0.88 | ... | ... | ... | ... | ... |
| 0000003 | 1.88 | 2.11 | ... | ... | ... | ... | ... | ... |
| 0000004 | ... | ... | ... | ... | ... | ... | ... | ... |
| ... | ... | | | | | | | |
| ... | ... | | | | | | | |

FIG. 6

| PATTERN ID | N-TH 0 OR 1 RANDOM NUMBERS | | | | | | | |
|---|---|---|---|---|---|---|---|---|
| 1000001 | 0 | 1 | 1 | 0 | 1 | 1 | 0 | ... |
| 1000002 | 0 | 0 | 1 | 1 | 1 | ... | ... | ... |
| 1000003 | 1 | 1 | 1 | 0 | 0 | ... | ... | ... |
| 1000004 | ... | ... | ... | ... | ... | ... | ... | ... |
| ... | ... | | | | | | | |
| ... | ... | | | | | | | |

EXAMPLE OF LEAFLET FORMAT

FIG. 8

2001:db8::dead:beaf ⟶ NODE IDENTIFIER  EXAMPLE) IPv6 ADDRESS

0000000000000000 ⟶ SYSTEM OPTION (ARBITRARY)

1001045 ⟶ LEAFLET GENERATION ID (RANDOM NUMBER PATTERN ID)

23401 ⟶ Y COORDINATE  ROW NUMBER OF y = Ax

1195 ⟶ Y VALUE

←–·–  BROADCASTING

FIG. 17 x:

| 1 | 2 | 3 | 4 | 5 | 6 | 7 | 8 | 9 | 10 | 11 | 12 | 13 | 14 | 15 | 16 |
|---|---|---|---|---|---|---|---|---|----|----|----|----|----|----|----|
| 85 | 0 | 3 | 102 | 0 | 0 | 0 | 0 | 0 | 0 | 69 | 0 | 0 | 0 | 28 | 0 |

$$A = \begin{bmatrix} 1 & 0 & 1 & 1 & 1 & 0 & 0 & 1 & 1 & 1 & 0 & 1 & 1 & 1 & 0 & 1 \\ 1 & 0 & 1 & 1 & 0 & 1 & 1 & 0 & 1 & 1 & 1 & 1 & 0 & 1 & 0 & 0 \\ 1 & 1 & 1 & 0 & 1 & 1 & 1 & 1 & 0 & 1 & 0 & 1 & 1 & 0 \\ 0 & 0 & 1 & 0 & 0 & 1 & 0 & 0 & 0 & 0 & 1 & 1 \\ 1 & 1 & 1 & 0 & 0 & 1 & 0 & 1 & 1 & 1 & 1 & 0 & 0 & 1 & 1 & 1 \\ 1 & 0 & 0 & 1 & 0 & 0 & 0 & 0 & 1 & 0 & 1 & 0 & 1 & 1 & 1 & 1 \\ 1 & 1 & 1 & 1 & 0 & 0 & 1 & 0 & 1 & 0 & 1 & 0 & 0 & 0 & 1 & 0 \\ 0 & 0 & 1 & 0 & 0 & 1 & 0 & 0 & 0 & 1 & 0 & 1 & 0 & 1 & 0 & 1 \\ 0 & 0 & 1 & 0 & 0 & 0 & 0 & 1 & 0 & 1 & 0 & 0 & 1 & 0 & 0 & 1 & 0 \end{bmatrix}$$

COMPRESSION RATIO $\sigma$    9/16=56.25%
DEGREE OF SPARSENESS $\rho$   4/16=25% y:

| 187 | 256 | 215 | 28 | 284 | 184 | 284 | 102 | 103 |
|---|---|---|---|---|---|---|---|---|

INFORMATION PROCESSING DEVICE, INFORMATION PROCESSING METHOD, AND PROGRAM

TECHNICAL FIELD

The present disclosure relates to an information processing device, an information processing method, and a program.

BACKGROUND ART

Since recent years, destinations for saving various kinds of data by communication terminals such as smartphones and tablet terminals have not been limited to recording media (for example, SD memory cards and the like) that are incorporated in or attached to the terminals, and storage regions on networks, such as so-called cloud storages, have become available with the development of communication technologies.

Also, various distributed storage systems into which so-called distribution technologies are introduced have also been proposed as network storages as described above in order to avoid or reduce influences of network congestion that accompanies communication with a plurality of communication terminals. For example, Patent Literature 1 discloses an example of a technology for realizing a distributed storage system.

CITATION LIST

Patent Literature

Patent Literature 1: JP 5498875B

SUMMARY OF INVENTION

Technical Problem

Meanwhile, a case in which it is difficult to record data in a network storage or to read data from the network storage due to failures or the like of a part of a server (storage node) or a network path may be assumed in a distributed storage system. Therefore, it may be necessary to employ countermeasures such as introduction of a technology for reconstructing data such as so-called redundant arrays of inexpensive disks (RAID), addition of storage nodes, and maintenance of the storage node at the time of the addition in the distributed storage system.

Under such circumstances, running costs of the distributed storage system tend to be relatively high. In particular, the scale of the distributed storage system has tended to increase in recent years, and the running costs of the system are expected to further increase.

Thus, the present disclosure proposes an information processing device, an information processing method, and a recording medium capable of achieving both continuity of the system running and reduction of the running cost under a situation in which a storage region on a network is used as a saving destination of various kinds of data.

Solution to Problem

According to the present disclosure, there is provided an information processing device including: a signal processing unit that encodes a first signal including one or more non-zero components based on first data and one or more zero components into a second signal with a shorter signal length than a signal length of the first signal on the basis of a matrix generated in accordance with a predetermined condition; a data generation unit that generates one or more pieces of second data by associating information indicating positions of signal elements in the second signal with the signal elements in the second signal; and a transmission unit that transmits each of the one or more generated pieces of second data to one or more devices connected via a network.

Moreover, according to the present disclosure, there is provided an information processing device including: an acquisition unit that acquires each of one or more pieces of second data, in which information indicating positions of signal elements in a second signal is associated with at least some signal elements of the signal elements in the second signal, the second signal having a shorter signal length than a signal length of a first signal and being obtained such that the first signal including one or more non-zero components based on first data and one or more zero components is encoded on the basis of a matrix generated in accordance with a predetermined condition, from one or more devices connected via a network; and a signal processing unit that decodes the first data on the basis of the one or more acquired pieces of second data and a restriction condition in accordance with row components corresponding to the signal elements associated with at least the second data among the row components of the matrix.

Moreover, according to the present disclosure, there is provided an information processing method including: encoding, by a computer, a first signal including one or more non-zero components based on first data and one or more zero components to a second signal with a shorter signal length than a signal length of the first signal on the basis of a matrix generated in accordance with a predetermined condition; and transmitting, by the computer, each of one or more pieces of second data, in which information indicating positions of signal elements in the second signal is associated with the signal elements in the second signal, to one or more devices connected via a network.

Moreover, according to the present disclosure, there is provided an information processing method including: acquiring, by a computer, each of one or more pieces of second data, in which information indicating positions of signal elements in a second signal is associated with at least some signal elements of the signal elements in the second signal, the second signal having a shorter signal length than a signal length of a first signal and being obtained such that the first signal including one or more non-zero components based on first data and one or more zero components is encoded on the basis of a matrix generated in accordance with a predetermined condition, from one or more devices connected via a network; and decoding, by the computer, the first data on the basis of the one or more acquired pieces of second data and a restriction condition in accordance with the matrix.

Moreover, according to the present disclosure, there is provided a recording medium with a program recorded therein, the program including: causing a computer to encode a first signal including one or more non-zero components based on first data and one or more zero components into a second signal with a shorter signal length than a signal length of the first signal on the basis of a matrix generated in accordance with a predetermined condition; and causing the computer to transmit each of one or more pieces of second data, in which information indicating positions of signal elements in the second signal is associated with the signal elements in the second signal, to one or more devices connected via a network.

Moreover, according to the present disclosure, there is provided a recording medium with a program recorded therein, the program including: causing a computer to acquire each of one or more pieces of second data, in which information indicating positions of signal elements in a second signal is associated with at least some signal elements of the signal elements in the second signal, the second signal having a shorter signal length than a signal length of a first signal and being obtained such that the first signal including one or more non-zero components based on first data and one or more zero components is encoded on the basis of a matrix generated in accordance with a predetermined condition, from one or more devices connected via a network; and causing the computer to decode the first data on the basis of the one or more acquired pieces of second data and a restriction condition in accordance with the matrix.

Advantageous Effects of Invention

As described above, the present disclosure provides an information processing device, an information processing method, and a recording medium capable of achieving both continuity of the system running and reduction of the running cost under a situation in which a storage region on a network is used as a saving destination of various kinds of data.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 2 is an explanatory diagram for describing a basic principle of operations of the information processing system according to present embodiment.

FIG. 3 is a diagram illustrating an example of data before and after encoding and information for the encoding in the information processing system according to the present embodiment.

FIG. 5 illustrates an example of a table of random numbers used to generate an observation matrix.

FIG. 6 illustrates an example of a table of random numbers used to generate an observation matrix.

FIG. 8 is a diagram illustrating an example of data in the leaflet.

FIG. 17 is an explanatory diagram for describing an example in which the information processing system according to the present embodiment is implemented.

DESCRIPTION OF EMBODIMENTS

Figure 1:
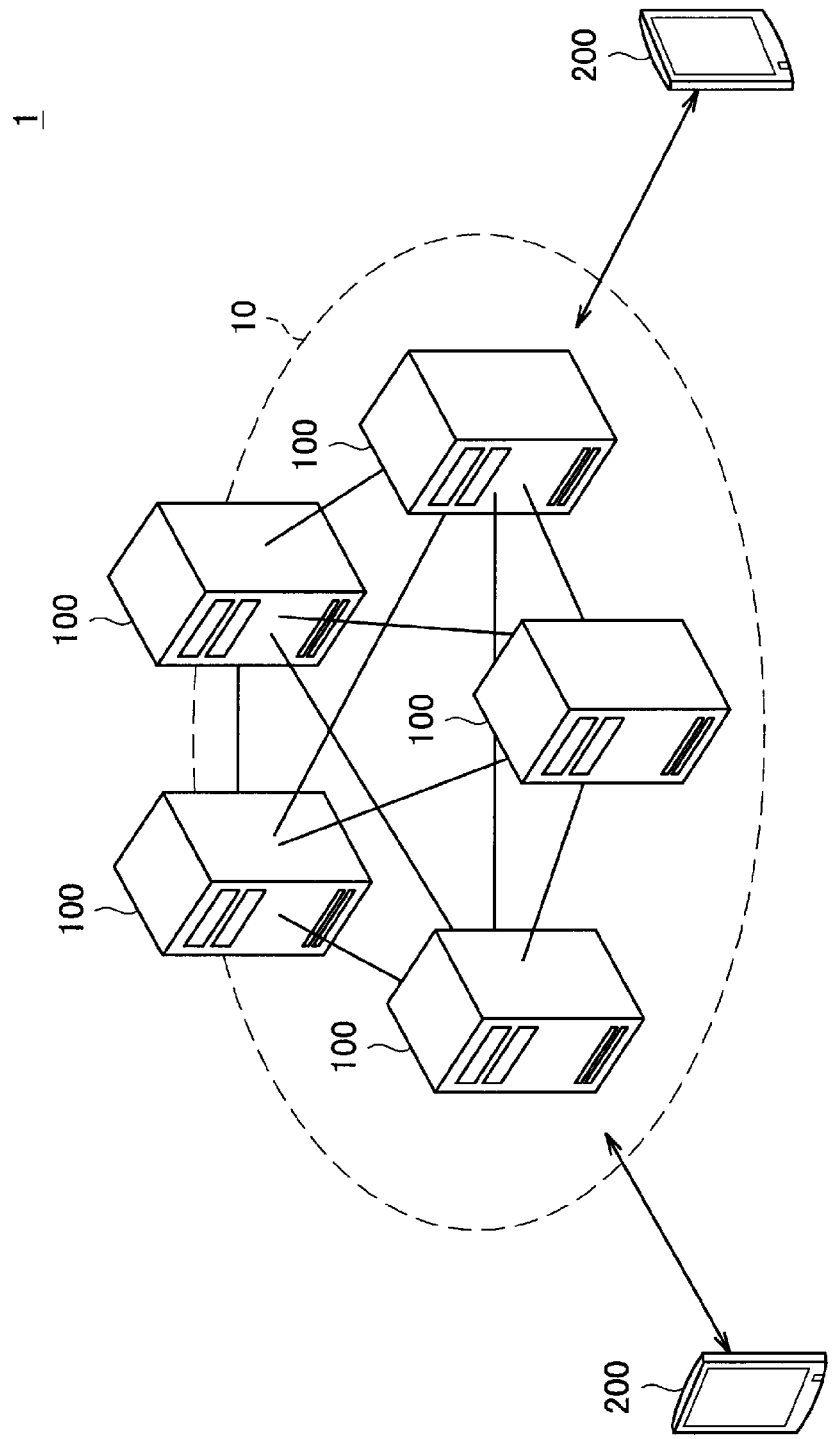
FIG. 1 is a diagram illustrating an example of a schematic system configuration of an information processing system according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
1. Introduction
1.1. System configuration
1.2. Review of network storage system
2. Technical features
2.1. Theoretical configuration of system
2.2. Compressed sensing
2.3. Leaflet
2.4. Distribution of leaflet (Scatter)
2.5. Maintaining of leaflet (Holder)
2.6. Collection of leaflet (Raker)
2.7. Function configuration
2.8. Processing
3. Example
4. Modification examples
4.1. First modification example: Example of condition for determining whether or not it is possible to reconstruct original signal
4.2. Second modification example: Example of system configuration
4.3. Third modification example: Example of operations of storage node that serves as scatter
5. Hardware configuration
6. Conclusion

1. INTRODUCTION

<1.1. System Configuration>

First, an example of a schematic system configuration of an information processing system according to an embodiment of the present disclosure will be described with reference to FIG. 1. FIG. 1 is a diagram illustrating an example of a schematic system configuration of an information processing system according to an embodiment of the present disclosure.

As illustrated in FIG. 1, an information processing system 1 according to the present embodiment includes a plurality of information processing devices 100 and one or more terminal devices 200. The information processing devices 100 are configured to be able to communicate with the terminal devices 200 via a predetermined network. That is, in the example illustrated in FIG. 1, the information processing devices 100 operate as servers, and the terminal devices 200 serve as clients and are connected to the information processing devices 100 via a network. Also, the information processing devices 100 may be configured to be able to communicate with the other information processing devices 100 via a predetermined network. Note that the type of the network between the information processing devices 100 and the terminal devices 200 and the type of the network among the plurality of information processing devices 100 are not particularly limited. For example, the networks may be configured of the Internet, a dedicated line, a local area network (LAN), a wide area network (WAN), or the like. Also, the networks may be configured of a wireless network or a wired network. In addition, the networks may include a plurality of networks, and at least a part of the networks may be configured of a wired network.

With such a configuration, each of the information processing devices 100 provides various network services to the terminal devices 200 in the information processing system 1 according to the present embodiment. Also, the plurality of information processing devices 100 may provide various network services (for example, cloud services) to the terminal devices 200 by operating as a group of a series of servers 10 in the information processing system 1.

In particular, the information processing system 1 according to the present embodiment provides a network storage service (for example, a cloud storage service) that enables usage of a storage region on a network by at least some of the plurality of information processing devices 100 operating as storage nodes. In a specific example, the information processing devices 100 that operate as storage nodes acquire data as a target of saving, which has been transmitted from another device (for example, the terminal device 200 or another information processing device 100), and holds the acquired data in a predetermined storage region, for example. In addition, the information processing devices 100 that operate as the storage nodes read the data held in the predetermined storage region and transmit the data to a device as a request source, on the basis of a request from another device (for example, the terminal device 200 or another information processing device 100). With such a configuration, the terminal devices 200 can use not only recording media (for example, SD memory cards or the like) incorporated in or attached to the terminal devices 200 itself but also the storage region on the network as saving destinations of various kinds of data.

Also, the information processing system 1 according to the present embodiment may be configured as a so-called distributed storage system that causes two or more information processing devices 100 that operate as the storage nodes to store data in a distributed manner. Note that the distributed storage system will additionally be described later. In this manner, it is possible to avoid or reduce influences of network congestion even if the number of terminal devices 200 that use the network storage increases, by the information processing system 1 being configured as the distributed storage system.

Note that the system configuration of the information processing system 1 illustrated in FIG. 1 is merely an example, and the system configuration of the information processing system 1 is not limited as long as it is possible to provide a network storage service on the basis of the plurality of devices connected via a network. Note that another example of the system configuration of the information processing system 1 according to the present embodiment will be additionally described later as a modification example.

The example of the schematic system configuration of the information processing system according to an embodiment of the present disclosure has been described above with reference to FIG. 1.

<1.2. Review of Network Storage System>

Next, an outline of the network storage system will be described, and technical problems of the information processing system 1 according to the present embodiment will then be summarized.

As described above, the saving destinations of various kinds of data for the terminal devices 200 (for example, communication devices such as smartphones or tablet terminals) are not limited to recording media incorporated in or attached to the terminal devices 200, and storage regions on the network, such as cloud storages, can be used. With such a mechanism, a user can save image data captured with a camera incorporated in a terminal such as a smartphone in a storage region on the network, for example.

Here, an outline of the cloud storage will be described. A cloud storage provides a center server on the network and provides a mechanism through which a client (in other words, a user) registered in advance can upload and download various kinds of data on the basis of a dedicated encryption protocol. That is, the cloud storage corresponds to a data storage system with security measures that uses a so-called client-server scheme as a basis.

Also, in the network storage system of the client-server scheme that communicates data with a large capacity, such as image data, through one-to-one transaction, network congestion may occur in a case where requests from a plurality of clients are received, and this may affect communication with the clients. In such circumstances, various distributed storage systems into which a so-called distribution technology has been introduced have also been proposed in recent years in order to avoid or reduce the influences of the network congestion by causing a plurality of storage nodes to store the data in a distributed manner.

Meanwhile, a situation in which access to some of the storage nodes is restricted due to failures of the storage nodes or failures of the network path may be considered in the distributed storage system. In such a case, it may be difficult to record data in the storage nodes to which access has been restricted, and to read data recorded in the storage nodes, and it may thus become difficult to use the network storage system itself. Therefore, it may be necessary to employ countermeasures such as introduction of technologies for reconstructing data such as RAID, addition of storage nodes, and maintenance of the storage node at the time of the addition in order to realize continuity of running of the distributed storage system.

Under such circumstances, running costs of the distributed storage system tend to be relatively high. In particular, since utilization of so-called big data has been required, and the scale of the distributed storage system has tended to increase in recent years, the running costs of the system are expected to further increase.

In view of the circumstances described above, the present disclosure proposes an example of a mechanism capable of achieving both continuity of system running and reduction of running costs in a situation in which a storage region on the network is used as a saving destination of various kinds of data.

2. TECHNICAL FEATURES

Hereinafter, technical features of the information processing system 1 according to the present embodiment will be described.

<2.1. Theoretical Configuration of System>

First, an example of a theoretical configuration of the information processing system 1 according to the present embodiment will be described with reference to FIG. 2. FIG. 2 is an explanatory diagram for describing a basic principle of operations of the information processing system 1 according to the present embodiment and illustrates an example of a theoretical configuration of the information processing system 1.

As illustrated in FIG. 2, the information processing system 1 includes an encoding processing device 300, a decoding processing device 400, and a holding device 500. Also, the respective devices that form the information processing system 1 serve at least one of three roles, namely a "scatter," a "holder," or a "raker." Note that the "scatter," the "holder," and the "raker" will additionally be described later.

The encoding processing device 300 generates one or more pieces of data by performing encoding processing on data to be saved in the network storage on the basis of information (for example, random numbers) generated on the basis of a predetermined condition and distributes each of the pieces of data to one or more holding devices 500. At this time, the encoding processing device 300 may decide the holding device 500 that will be a distribution destination of each piece of data randomly or on the basis of a rule decided by an arbitrary protocol. Note that the role of distributing the one or more generated pieces of data to other devices (for example, the holding devices 500) corresponds to the "scatter." That is, the encoding processing device 300 plays the role of the "scatter." In addition, the pieces of data will also be referred to as "leaflets" in the following description. Note that details of the leaflets will be additionally described later.

Each holding device 500 corresponds to a storage node that holds various kinds of data in the distributed storage system. Specifically, one or more leaflets distributed by the encoding processing device 300 are acquired from the encoding processing device 300 or another holding device 500. Note that the holding device 500 may hold the acquired leaflets, discard the leaflets, or transfer the leaflets to another holding device 500 in accordance with a state of the holding device 500 itself (an internal state, for example). In a specific example, the holding device 500 may hold the acquired leaflets in a storage region associated with the holding device 500 itself. Also, the holding device 500 may transfer the acquired leaflets or at least some of the leaflets held in the storage region to another holding device 500 or may discard the leaflets. In this manner, the holding device 500 may independently decide how to handle the leaflets distributed to the holding device 500 itself without depending on another device. In other words, the aforementioned encoding processing device 300 does not necessarily recognize operations and states of the holding device 500 as a transfer destination of the leaflets, and it is also not necessary for the encoding processing device 300 to ascertain the distribution destination of each leaflet. Note that the role of holding the distributed leaflets corresponds to the "holder." That is, the holding device 500 plays the role of the "holder." Also, since the holding device 500 may transfer the leaflets to another holding device 500 as described above, the holding device 500 may play the role of the "scatter."

The decoding processing device 400 collects the leaflets held by the holding devices 500 from the one or more holding devices 500. In a specific example, the decoding processing device 400 may collect the leaflets held by a holding device 500 that has reacted in response to an arbitrary broadcasting or multicasting protocol from the holding device 500. Note that the role of collecting the leaflets held by each holding device 500 (holder) corresponds to the "raker." That is, the decoding processing device 400 plays the role of the "raker."

Then, the decoding processing device 400 decodes original data on the basis of the collected leaflets. Note that the decoding processing device 400 does not necessarily collect all the leaflets generated by encoding the original data at this time and can decode the original data only from some of the leaflets that satisfy a predetermined condition. Note that details of the encoding processing and the decoding processing for realizing the functions will be additionally described later.

On the basis of the aforementioned configuration, the information processing system 1 according to the present embodiment the following features.

Feature 1: It is not necessary for a node that serves as a distribution source (that is, the encoding processing device 300 or the holding device 500) to recognize a distribution destination where each leaflet is present.

Feature 2: Each storage node (holding device 500) can independently operate without depending on a state of another device.

Feature 3: Since information (random numbers) for encoding, which has been used to generate the leaflet, is required to recover the original data from the leaflet, and it is difficult to recover the original data only from the leaflet, it is possible to secure confidentiality of information.

Feature 4: Since it is not necessary for all the storage nodes (holding devices 500) to which the leaflets have been distributed to operate when the original data is recovered, it is possible to independently maintain the individual storage nodes without depending on the other storage nodes.

Note that the encoding processing device 300, the decoding processing device 400, and the holding device 500 may be realized by at least any of the plurality of information processing devices 100 illustrated in FIG. 1, for example. In other words, at least any of the plurality of information processing devices 100 can play at least any of the three roles, namely the "scatter", the "holder", and the "raker". That is, the information processing device 100 can be in five states, namely "holding", "discarding", "transferring", "distributing", and "collecting" as states in relation to handling of the leaflets in the information processing system 1 according to the present embodiment. Note that correspondence between the three roles as the "scatter", the "holder", and the "raker" and the five states in "holding", "discarding", "transferring", "distributing", and "collecting" is as follows.

Scatter: distributing, transferring
Holding: holding, discarding
Raker: collecting Note that the information processing device 100 may play roles of the plurality of devices among the encoding processing device 300, the decoding processing device 400, and the holding device 500. In a specific example, a part of the information processing devices 100 may operate both as the encoding processing device 300 and as the holding device 500. Also, a part of the information processing devices 100 may operate both as the encoding processing device 300 and as the decoding processing device 400 in another example.

The example of the theoretical configuration of the information processing system 1 according to the present embodiment has been described above with reference to FIG. 2.

<2.2. Compressed Sensing>

Next, a technology for realizing the encoding and the decoding of data in the information processing system 1 according to the present embodiment will be described. In the information processing system 1 according to the present embodiment, a technology called compressed sensing is used to encode and decode data.

The compressed sensing is a paradigm that enables reconstruction of a signal in an original form (hereinafter, also referred to as an "original signal") from a small amount of observation result for a signal that can sparsely be expressed. Examples of reference literature related to the compressed sensing include Reference Literature 1: "E J Candes and two others, "Robust Uncertainty Principles: Exact Signal Reconstruction From Highly Incomplete Frequency Information", [online], February 2006, IEEE TRANSACTIONS ON INFORMATION THEORY, VOL. 52, NO. 2, p. 489 to 502, [searched on Nov. 1, 2016], Internet <URL: http://people.ee.duke.edu/~lcarin/01580791.pdf>. Reference Literature 1 presented an example in which it is possible to completely recover an original image through 1/50 sampling of a Nyquist rate on the assumption that a space change rate of the original image is sparse.

Also, examples of another reference literature include Reference Literature 2: "Gang Huang and three others, "Lensless Compressive Sensing Imaging", [online], January 2013, Bell Labs., Alcatel-Lucent, Murray Hill, N.J., USA, [searched on Nov. 1, 2016], Internet <URL: https://arxiv.org/ftp/arxiv/papers/1302/1302.1789.pdf>. Reference Literature 2 discloses a camera that collects light at one point for each blocking and transmission pattern using an aperture assembly (for example, a transmission-type LCD panel) in a lattice form capable of randomly blocking and transmitting light from an object and repeatedly reads the collected light as an electric signal with one sensor, such as a photodiode, installed after the point. Reference Literature 2 discloses that it is possible to recover the object image using the compressed sensing technology on the basis of a signal value read for each pattern with such a configuration.

In this manner, the compressed sensing is an idea based on a mathematical theory capable of recovering original signal from a signal in a sparse state (mathematically, a state in which most components are zero components if an appropriate base is used) with a small number of times of observation. Thus, recovery of a signal using the compressed sensing will be described below in a level of an outline. Note that since the compressed sensing itself is known as described above, known literatures should be referred to for details of the theory, and detailed description will be omitted herein.

A problem of the compressed sensing is to recover the original signal when the original signal and an observation result are connected to each other using an appropriate observation matrix in a case in which the number K of non-zero components is small (that is, in a K-sparse state) in observation with a condition of "the number of samples (the number of times of observation) M<the original signal length N" as represented below as (Formula 1). In other words, it is also state that the problem of the compressed sensing is a problem of simultaneous linear indeterminate equation for obtaining a sparse signal x. Here, an observation result is assumed to y (M-order), an original signal is assumed to x (N-order), and a problem capable of representing a relationship therebetween on the basis of an appropriate observation matrix A will be considered.

$$y = Ax \longrightarrow \begin{bmatrix} y_1 \\ \cdot \\ \cdot \\ y_M \end{bmatrix} = \begin{bmatrix} a_{11} & a_{12} & \cdot & \cdot & \cdot & a_{1N-1} & a_{1N} \\ \cdot & \cdot & \cdot & \cdot & \cdot & \cdot & \cdot \\ \cdot & \cdot & \cdot & \cdot & \cdot & \cdot & \cdot \\ a_{M1} & a_{M2} & \cdot & \cdot & \cdot & a_{MN-1} & a_{MN} \end{bmatrix} \begin{bmatrix} x_1 \\ x_2 \\ \cdot \\ \cdot \\ \cdot \\ x_{N-1} \\ x_N \end{bmatrix} \quad \text{(Formula 1)}$$

Observation number M (measurement number)

Non-zero component K Many zero components are present at arbitrary positions

Original signal length N

It is typically known that a method of solving a problem of the compressed sensing results from minimizing (in other words, regularizing) of an appropriate cost function J(x) under restriction based on an observation value as represented as (Formula 2) below.

$$x = \underset{x}{\operatorname{argmin}} J(x) \text{ subject to } y = Ax \quad \text{(Formula 2)}$$

Note that what is to be used as the cost function J(x) and what kind of algorithm is to be used for the minimization under the restriction condition have been argued in various manners. For example, Reference Literature 3: "Imaging via Compressive Sampling", [online], March 2008, IEEE SIGNAL PROCESSING MAGAZINE, p. 14 [searched on Nov. 1, 2016], Internet <URL: http://authors.library.caltech.edu/10093/1/ROMieeespm08.pdf> argues the cost function J(x) and typical solutions. Specifically, according to Reference Literature 3, a cost function is introduced on the basis of a change rate between an image on which base conversion such as DCT has been performed and a pixel value itself, thereby solving the minimization problem of L1 norm. It is a matter of course that the solution disclosed in Reference Literature 3 is merely an example, and a large number of solutions for the formula represented above as {Formula 2} are present, and the solutions are not necessarily limited in the technology proposed in the present disclosure. In other words, it is desirable to produce new advantages by applying typical characteristics that are common to overall compressed sensing according to the embodiment.

Here, a specific example will be described below. For example, the example describes that a correlation between adjacent pixels is high in a natural image, and it is possible to recover an original image by using a difference between pixels as a target minimum function of the L1 norm (that is, the aforementioned cost function J(x)). It is assumed that an observation result y is obtained by observing a stationary image x using an appropriate observation matrix A. In this case, the formula described above as (Formula 2) can be represented by formulae described below as (Formula 3) and (Formula 4).

$$x = \underset{x \in R^N}{\operatorname{argmin}} \sum_{i,j} \|(\nabla x)_{i,j}\|_1 \text{ subject to } y = Ax \quad \text{(Formula 3)}$$

$$x = \underset{x \in R^N}{\operatorname{argmin}} \sum_{i,j} (|x_{i,j} - x_{i+1,j}| + |x_{i,j} - x_{i,j+1}|) \quad \text{(Formula 4)}$$

subject to $y = Ax$

Note that Reference Literature 4: "KAKIUCHI Tomoki and one other, "Review related to CT image reconstruction using compressed sensing in restricted X-ray projection", [online], 2015, 77th National Convention IS05, p. 2-361 to 2-362, [searched on Nov. 1, 2016], Internet <URL: http://www.cc.kyoto-su.ac.jprkano/pdf/paper/2015%20IPSJ77%201S-05.pdf>" is exemplified as a reference literature presenting a specific example in which the aforementioned cost function is used. Note that the cost function represented in (Formula 3) and (Formula 4) described above is also referred to as a total variance in general. As described above, the compressed sensing is known as a typical technology for recovering original data (for example, an original image) on the basis of a small number of observation values.

Next, an outline of the compressed sensing has been described above as a technology for encoding and decoding data in the information processing system 1 according to the embodiment.

<2.3. Leaflet>

Next, an outline of a leaflet in the information processing system 1 according to the present embodiment will be described. As described above, the encoding processing device 300 (scatter) generates one or more leaflets by performing encoding processing on original data and distributes the generated leaflets to an arbitrary holding device 500 (holder) in the information processing system 1 according to the present embodiment. The decoding processing device 400 (raker) collects the leaflets held by the arbitrary holding device 500 (holder) from the holding device and recovers the original data on the basis of the collected leaflets.

For example, FIG. 3 is a diagram illustrating an example of data before and after encoding and information for the encoding in the information processing system 1 according to the present embodiment. In FIG. 3, the original signal x corresponds to a signal based on the original data. Also, the matrix A corresponds to information for encoding the original signal x, and the signal y corresponds to a signal obtained by encoding the original signal x on the basis of the matrix A. Here, each row component of the signal y is calculated on the basis of the original signal x and the corresponding row component in the matrix A. In a specific example, a row component on the first row of the signal y is calculated on the basis of the original signal x and a row component on the first row in the matrix A. In other words, information (that is, a Y coordinate) indicating the position of each signal component of the signal y in the signal y corresponds to a row component in the matrix A that is used to generate the signal component. Therefore, it is possible to specify, on the basis of the information indicating the position of each signal component of the signal y in the signal y, which row component in the matrix A has been used when the signal component is generated. On the basis of such properties, the encoding processing device 300 generates a leaflet by associating each signal component of the signal y that is calculated by encoding the original signal x on the basis of the matrix A with the information indicating the position (for example, a row) of the signal component in the signal y.

Figure 4:
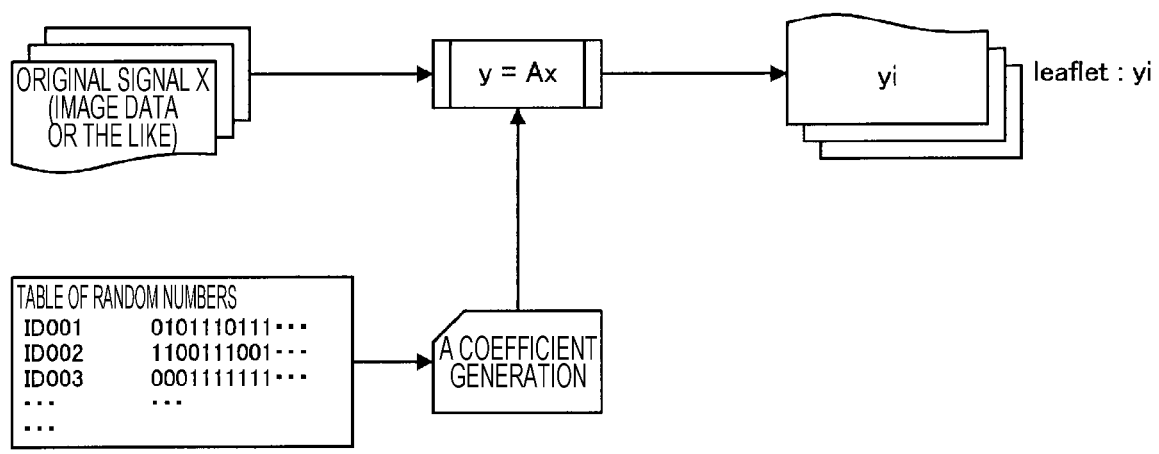
FIG. 4 is an explanatory diagram for describing an outline of a method of generating a leaflet.

Next, an outline of a method of generating a leaflet will be described with reference to FIG. 4. FIG. 4 is an explanatory diagram for describing an outline of the method of generating a leaflet. Note that although a case in which the leaflet is generated by encoding image data will be described as an example in the description, data to be encoded is not necessarily limited to image data.

As illustrated in FIG. 4, the signal y is generated by performing encoding processing based on the observation matrix A on the original signal x (sparse signal) based on the original image data, and the leaflet is generated on the basis of each signal component $y_i$ of the signal y. Note that the original signal x may be information of the original image data itself or may be information that is obtained by performing predetermined arithmetic processing (for example, image processing such as edge extraction) on the image data, for example. Also, the method of generating the signal y on the basis of the original signal x and the observation matrix A is as described above with reference to (Formula 1).

Also, it is possible to apply a coefficient matrix generated on the basis of a pseudorandom number generator capable of reproducing each component, for example, as the observation matrix A. Note that there are multiple reproducible pseudorandom number generators (with periodicity, for example), the pseudorandom number generator may be realized by causing a node (the encoding processing device 300, for example) that generates the leaflet to hold a table of random numbers in advance in a simple example.

For example, FIGS. 5 and 6 illustrate examples of tables of random numbers used to generate an observation matrix A. For example, the example illustrated in FIG. 5 illustrates an example of a table of random numbers using actual random number from 0 to 2. In addition, the example illustrated in FIG. 6 illustrates an example of a table of random numbers using a random number of 0 or 1. It is a matter of course that the examples illustrated in FIGS. 5 and 6 are merely examples, and the types of the random numbers used to generate the observation matrix A are not particularly limited as long as it is possible to reproduce each component of the observation matrix A. In addition, the method of generating the observation matrix A is not necessarily limited only to the generation method based on the random numbers as long as it is possible to reproduce each component of the observation matrix A.

Figure 7:
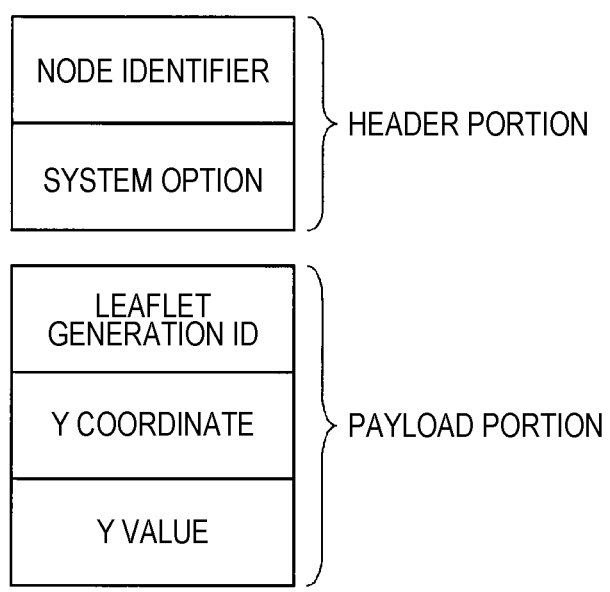
FIG. 7 is a diagram illustrating an example of a data structure of the leaflet.

Next, an example of a data structure (format) of a leaflet will be described with reference to FIGS. 7 and 8. FIG. 7 is a diagram illustrating an example of a data structure of the leaflet. In addition, FIG. 8 is a diagram illustrating an example of data in the leaflet.

As illustrated in FIG. 7, the data structure (format) of the leaflet includes a header portion and a payload portion. The header portion includes various kinds of control information that is mainly related to the leaflet. In a specific example, the header portion includes a node identifier and information indicating a system option. Also, the payload portion includes a leaflet generation ID, information indicating a Y coordinate, and information indicating a Y value.

The node identifier indicates an identifier for specifying a node (for example, the encoding processing device 300) that owns the original signal x. Specific examples of the notification identifier include an IP address of the node that owns the original signal x as illustrated in FIG. 8, for example. It is a matter of course the type of information held as the node identifier is not particularly limited as long as it is possible to specify the node that owns the original signal x.

The information indicating the Y value corresponds to the signal component $y_i$ of the y signal generated by encoding the x signal on the basis of the observation matrix A. Also, the information indicating the Y coordinate indicates the position of the signal component $y_i$ associated with the leaflet as information indicating the Y value in the y signal (that is, the row number of y=Ax).

The leaflet generation ID is information for specifying a coefficient (random number) pattern of the observation matrix A used to generate the y signal. In a specific example, the leaflet generation ID may be information (for example, a pattern ID or the like of the random numbers illustrated in FIGS. 5 and 6) for specifying the coefficient pattern of the row component used to calculate the Y value (that is, the signal component $y_i$) in the observation matrix A used to generate the y signal. Also, in another example, the leaflet generation ID may be information for specifying the observation matrix A itself used to generate they signal.

The system option indicates arbitrary information that is supplementarily added. For example, information or the like that can be used by another node (the holding device 500 or the decoding processing device 400, for example) that plays the role in the holder or the raker to handle the leaflet may be associated with the leaflet as a system option. In a more specific example, information that can be used for system control, information corresponding to an expansion variable, and the like, such as a period during which the leaflet stays on the storage or a lifetime of the leaflet may be associated as a system option with the leaflet.

Also, although the example in which one payload portion is provided for the data structure of one leaflet is illustrated in the example in FIG. 7, a plurality of payload portions may be provided for one leaflet. In such a case, an expansion indicator such as information indicating that a plurality of payload portions is included, the number of payload portions, and start positions of the plurality of payload portions that are continuously connected may be associated as a system option with the leaflet.

In this manner, the leaflet is generated by associating each signal component $y_i$ of the y signal obtained by multiplying the original signal x based on the original data by the observation matrix A that is configured using a reproducible random number as a coefficient with the Y coordinate of the signal component $y_i$ and forming it as a package.

The processing related to the generation of the leaflet has been described above with reference to FIGS. 3 to 8.

<2.4. Distribution of Leaflet (Scatter)>

Next, processing related to distribution of the leaflet by a node that serves as the scatter will be described. For example, FIGS. 9 and 10 are explanatory diagrams for describing a node that serves as the scatter and illustrate an outline of processing related to distribution of the leaflet.

Figure 9:
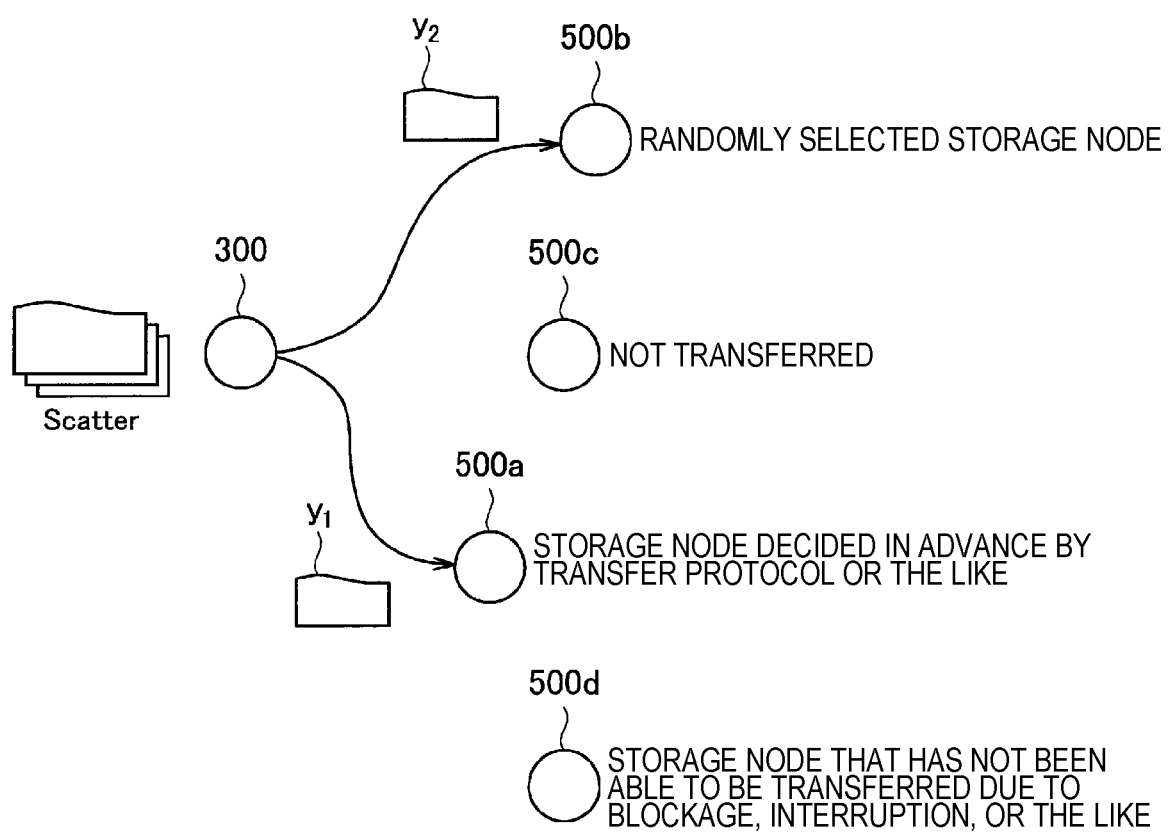
FIG. 9 is an explanatory diagram for describing a node that serves as a scatter.

As illustrated in FIG. 9, the node (the encoding processing device 300 or the holding device 500, for example) that serves as the scatter distributes or transfers the leaflet to a storage node that has randomly been selected or a storage node decided in advance by a transfer protocol or the like. Also, each node that serves as a distribution source of the leaflet may freely decide the transfer protocol that decides the storage node that serves as a distribution destination of the leaflet in accordance with a situation. That is, the information processing system 1 according to the present embodiment has a feature that the information processing system 1 has a degree of freedom in deciding the transfer destination of the leaflet, as one of features. Note that even if the leaflet is transferred in an overlapping manner, this does not affect recovery of the original signal x based on the leaflet although details will be described later. With such a configuration, it is also possible to define the transfer protocol such that the leaflet is distributed in a proportional manner in accordance with the capacity of the storage region of each storage node, for example.

Figure 10:
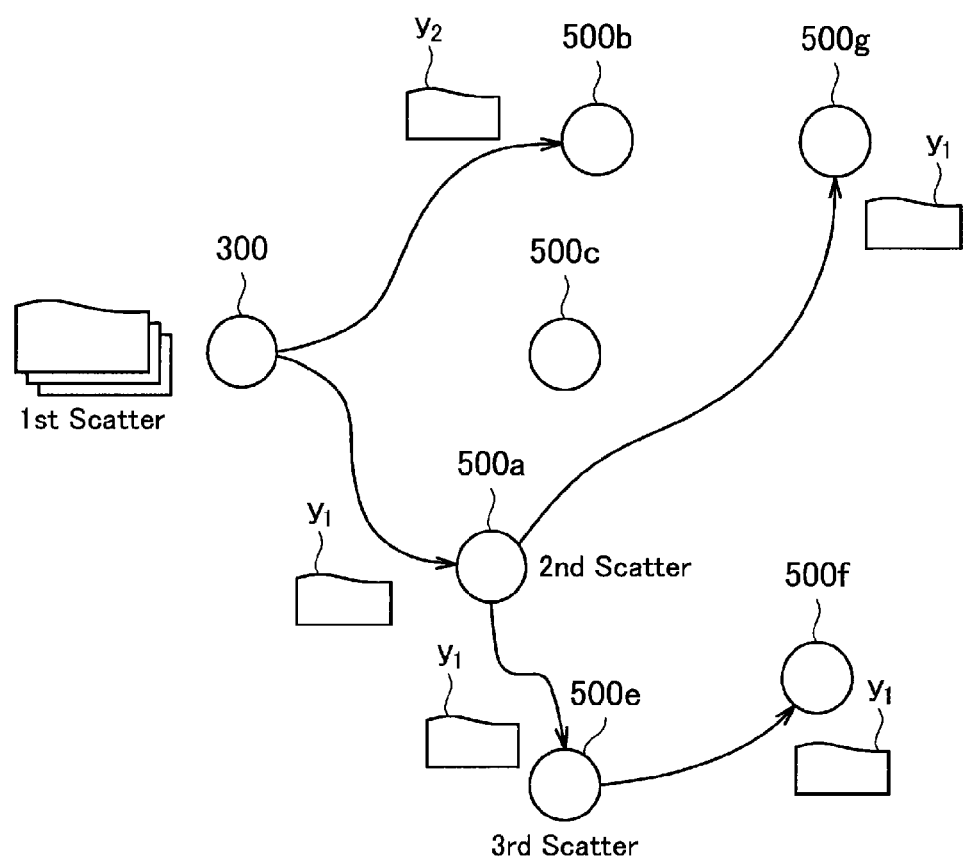
FIG. 10 is an explanatory diagram for describing a node that serves as a scatter.

In addition, each storage node, to which the leaflet has been distributed, may serve as a new scatter and transfer the leaflet to another storage node (another holding device 500, for example) in the information processing system 1 according to the present embodiment as illustrated in FIG. 10. That is, each storage node, to which the leaflet has been distributed, may independently control the transfer of the leaflet in accordance with a situation. In addition, each storage node, to which the leaflet has been distributed, may hold the leaflet and then transfer a copy of the leaflet to another storage node.

In a specific example, the encoding processing device 300 serves as a first scatter, distributes a generated leaflet $y_1$ to a holding device 500a, and distributes a leaflet $y_2$ to a holding device 500b in the example illustrated in FIG. 10. In addition, the holding device 500a that has received the distribution of the leaflet $y_1$ from the encoding processing device 300 serves as a second scatter and transfers the leaflet $y_1$ to holding devices 500e and 500g. Similarly, the holding device 500e to which the leaflet $y_1$ has been transferred from the holding device 500a serves as a third scatter and transfers the leaflet $y_1$ to a holding device 500f. At this time, each of the holding devices 500a, 500e, 500g, and 500f may hold the distributed or transferred leaflet $y_1$. In this manner, the leaflet $y_1$ is locally present at the holding devices 500a, 500e, 500g, and 500f. Note that the holding device 500b that has received the distribution of the leaflet $y_2$ from the encoding processing device 300 may serve as a second scatter and transfer the leaflet $y_2$ to another holding device 500 similarly to the holding device 500a.

In this manner, it is possible to increase the degree of freedom in relation to the handling of the leaflet at each storage node by permitting overlapping of at least a part of leaflets (that is, copying of the leaflet is allowed), and further, it is possible to further improve diffusion and distribution properties of the leaflet.

The processing related to the distribution of the leaflet using the node that serves as the scatter has been described above with reference to FIGS. 9 and 10.

<2.5. Holding of Leaflet (Holder)>

Figure 11:
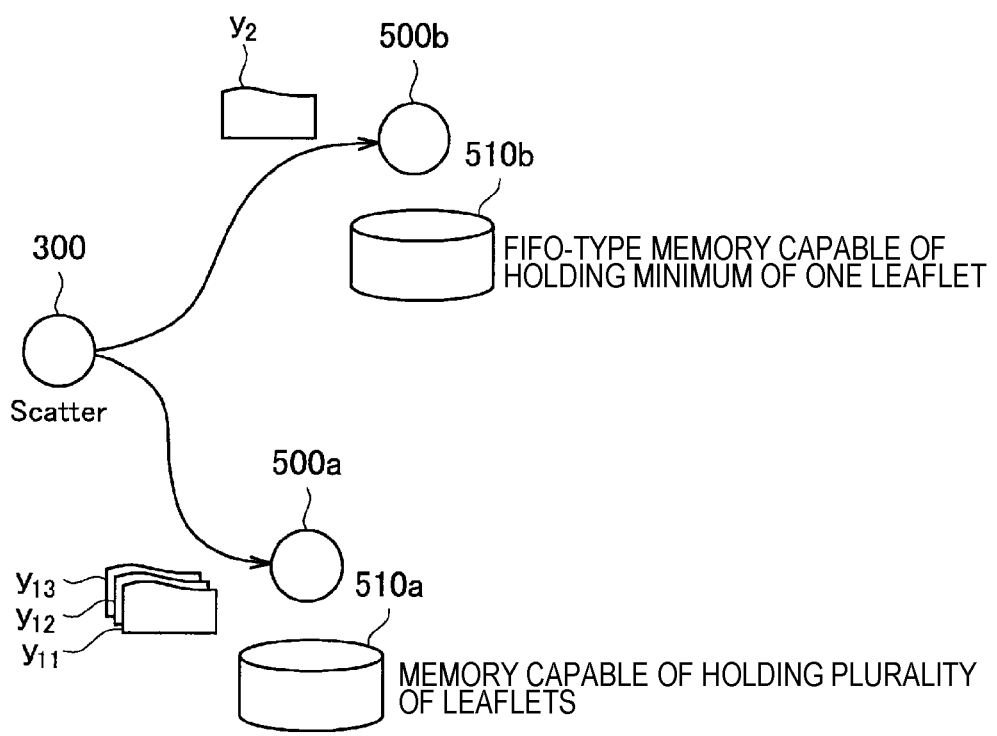
FIG. 11 is an explanatory diagram for describing a storage node that serves as a holder.

Next, an example of a configuration of a storage node that serves as a holder will be described. For example, FIGS. 11 and 12 are explanatory diagrams for describing a storage node that serves as a holder.

As described above, the storage node that serves as a holder (the holding device 500, for example) receives distribution or transfer of a leaflet from a node that serves as a scatter and holds the leaflet. Therefore, the storage node that serves as a holder has a storage region for holding the distributed or transferred leaflet. Note that it is sufficient that a capacity with which at least one leaflet can be held is secured for the storage region, and the type of the device is also not particularly limited. In a specific example, the storage region of the storage node that serves as a holder may be configured as a memory of a first-in/first-out (FIFO) type capable of holding at least one leaflet as illustrated with the reference numeral 510*b* in FIG. 11. Also, in another example, the storage region of the storage node that serves as a holder may be configured as a memory capable of holding a plurality of leaflets as illustrated with the reference numeral 510*a* in FIG. 11.

Figure 12:
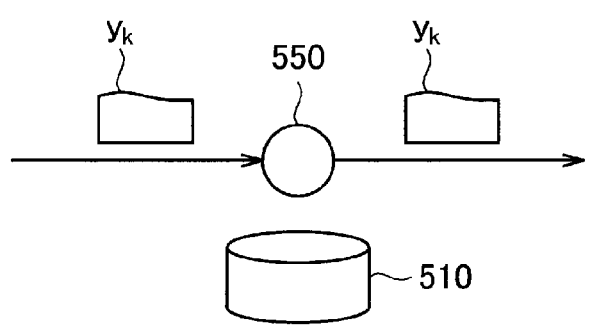
FIG. 12 is an explanatory diagram for describing a storage node that serves as a holder.

In addition, the storage node that serves as a holder may serve as a scatter as illustrated in FIG. 12. That is, the storage node may hold the distributed or transferred leaflet in the storage region in the storage node itself and may transfer the leaflet itself or a copy of the leaflet to another storage node for convenience of the storage node itself.

The example of the configuration of the storage node that serves as a holder has been described above with reference to FIGS. 11 and 12.

<2.6. Collection of Leaflet (Raker)>

Next, processing related to collection of the leaflet by a device that serves as a raker will be described. For example, FIG. 13 is an explanatory diagram for describing a node that serves as a raker and illustrates an outline of processing related to distribution of a leaflet.

A node that serves as a raker (the recovery processing device 400, for example) collects a leaflet from each storage node (the holding device 500, for example) on the network and reconfigures (decodes) original data on the basis of the leaflet. Note that the node that serves as a generation source of the leaflet (that is, the encoding processing device 300) may serve as a raker.

Figure 13:
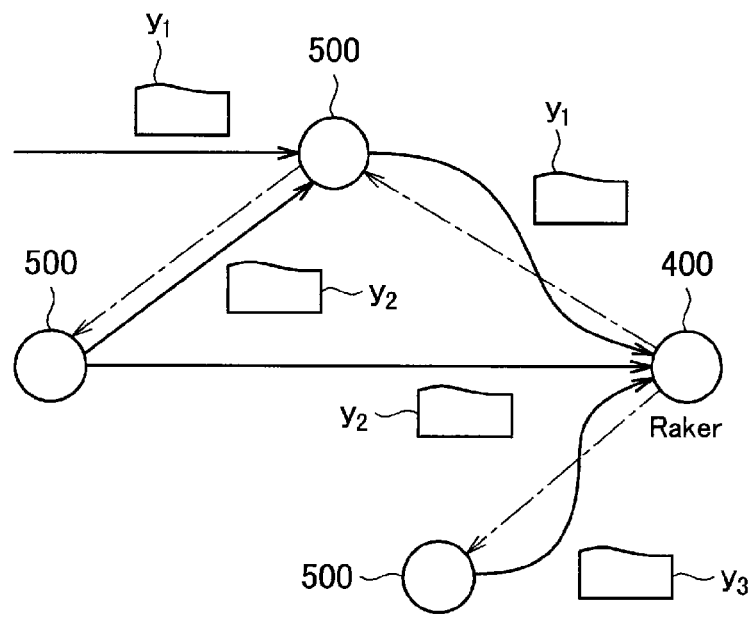
FIG. 13 is an explanatory diagram for describing a node that serves as a raker.

In a specific example, the node that serves as a raker may call for transmission of the leaflet held by the storage node by performing broadcasting (or multicasting) for each storage node on the basis of a predetermined protocol as illustrated in FIG. 13. At this time, the node that serves as a raker may designate a leaflet as a target of transmission by designating a condition based on a node identifier, information included in a system option (a unique identifier or the like, for example). With such a configuration, the node that serves as a raker can collect the leaflet from the storage node that has reacted in response to the broadcasting.

Also, the node that serves as a raker may collect the leaflet on the basis of an access list that indicates a transfer destination of each leaflet by each storage node (the holding device 500, for example) generating the access list in advance in another example. For example, Reference Literature 5: JP 2003-6087A discloses a technology related to generation of the access list and a technology that enables downloading of target content by using the access list, and the technologies may be applied to collection of the leaflet.

In addition, the broadcasting from the node that serves as a raker to each storage node may be in a multilayered form as illustrated in FIG. 13. That is, the broadcasting from the node that serves as a raker may be transmitted to another storage node via one or more storage nodes. With such a configuration, the node that serves as a raker can call for transmission of the leaflet to more storage nodes.

Note that a storage node that has received the broadcasting may transmit the leaflet directly (unicasting) to the node that serves as a raker. Also, a protocol or the like for transferring the leaflet to the transmission source of the broadcasting may be newly defined in order to reduce a load on the node that serves as a raker.

Then, the node that serves as a raker uses the collected leaflet and decodes original data (image data, for example) on the basis of the aforementioned compressed sensing technology. Details of the processing of decoding the original data from the collected leaflet will additionally be described later.

The processing related to the collection of the leaflet using the device that serves as a raker has been described above with reference to FIG. 13.

<2.7. Function Configuration>

Figure 14:
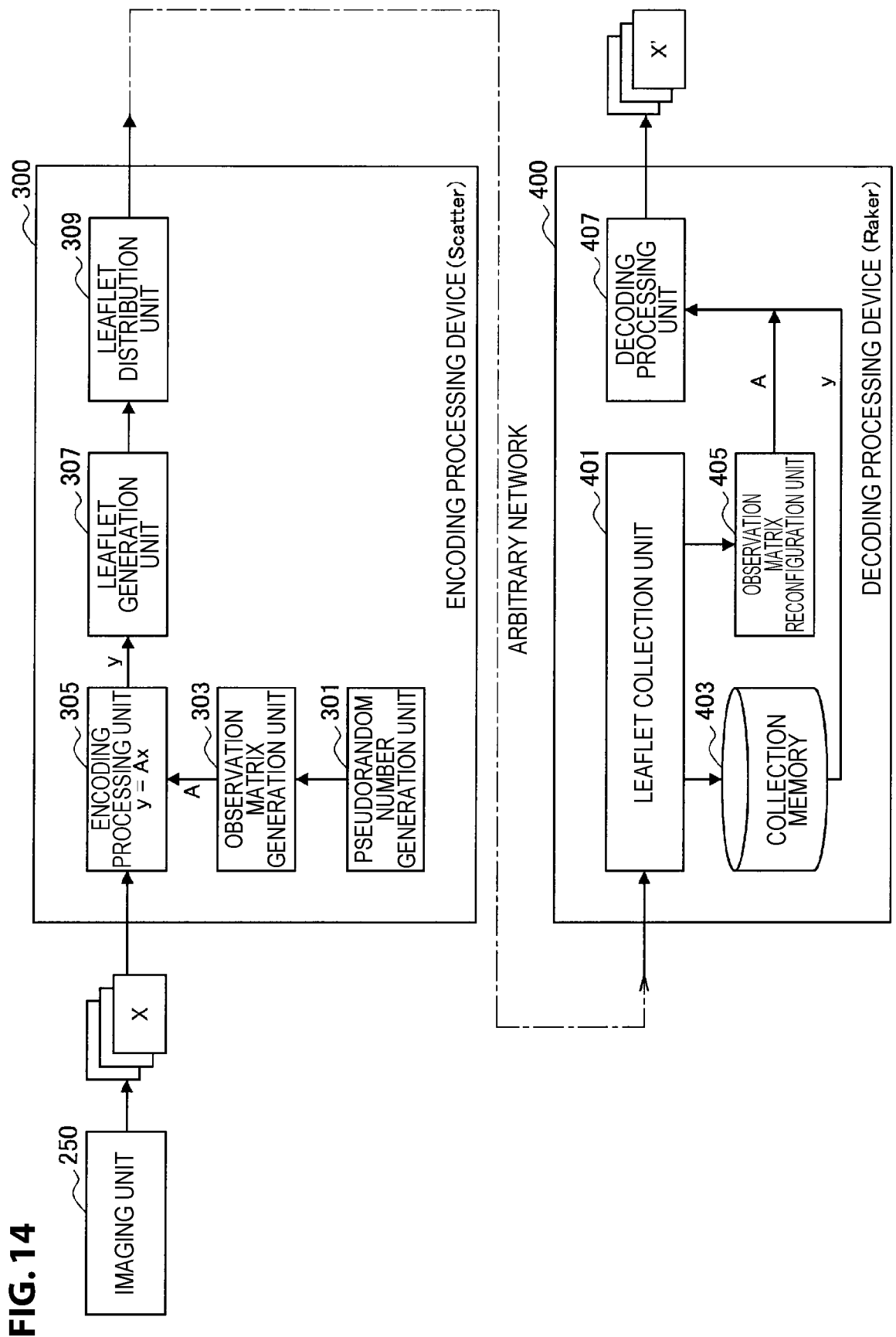
FIG. 14 is a block illustrating an example of a functional configuration of an information processing system according to the present embodiment.

Next, an example of a function configuration of the information processing system 1 according to the present embodiment will be described by paying attention to the encoding processing device 300 that serves as a scatter and the decoding processing device 400 that serves as a raker, in particular. For example, FIG. 14 is a block diagram illustrating an example of a function configuration of the information processing system 1 according to the present embodiment and illustrates an example of the respective function configurations of the encoding processing device 300 and the decoding processing device 400. Note that the description will be given on the assumption that a sparse original signal x based on image data captured by an imaging unit 250 is a target of encoding.

(a) Encoding Processing Device (Scatter)

First, an example of a function configuration of the encoding processing device 300 that serves as a scatter will be described. As illustrated in FIG. 14, the encoding processing device 300 includes a pseudorandom number generation unit 301, an observation matrix generation unit 303, an encoding processing unit 305, a leaflet generation unit 307, and a leaflet distribution unit 309.

The pseudorandom number generation unit 301 corresponds to the aforementioned reproducible pseudorandom number generator. The pseudorandom number generation unit 301 generates a reproducible pseudorandom number on the basis of a condition decided in advance and outputs the generated pseudorandom number to the observation matrix generation unit 303. In addition, the pseudorandom number generation unit 301 holds a table of random numbers generated in advance and outputs the pseudorandom number to the observation matrix generation unit 303 on the basis of the table of random numbers as described above with reference to FIGS. 5 and 6.

The observation matrix generation unit 303 generates the observation matrix A described above with reference to FIG. 3 on the basis of the pseudorandom number output from the pseudorandom number generation unit 301 and outputs the generated observation matrix A to the encoding processing unit 305.

The encoding processing unit 305 acquires the observation matrix A generated on the basis of the pseudorandom number from the observation matrix generation unit 303 in advance and holds the observation matrix A. In addition, the encoding processing unit 305 receives an input of the sparse original signal x based on image data captured by the imaging unit 250 as a signal that is a target of encoding. The encoding processing unit 305 generates the signal y after the encoding processing by encoding the input original signal x on the basis of the observation matrix A. Note that a method of generating the signal y is as described above with reference to (Formula 1). In addition, the encoding processing unit 305 outputs the signal y generated by encoding the original signal x to the leaflet generation unit 307. Note that the encoding processing unit 305 corresponds to an example of the "signal processing unit" in the information processing device 100 that serves as a scatter.

The leaflet generation unit 307 generates one or more leaflets on the basis of the signal y generated by the encoding processing unit 305. Specifically, the leaflet generation unit 307 generates a leaflet $y_i$ by associating information (Y coordinate) indicating the position of each signal element (Y value) of the signal y in the signal y with the signal element as described above with reference to FIG. 7. Note that the leaflet generation unit 307 may associate the aforementioned information such as a leaflet generation ID, a node identifier, and a system option with the leaflet $y_i$ at this time. Then, the leaflet generation unit 307 outputs the one or more leaflets $y_i$ generated on the basis of the signal y to the leaflet distribution unit 309. Note that as described above, the leaflet generation ID may be information for specifying a coefficient pattern of a row component that is used to calculate the Y value (that is, a signal component of the signal y) in the observation matrix A or may be information for specifying the observation matrix A itself. In addition, the leaflet generation unit 307 corresponds to an example of the "data generation unit".

The leaflet distribution unit 309 distributes the one or more leaflet $y_i$ generated by the leaflet generation unit 307 to another storage node (the holding device 500, for example) that serves as a holder via a predetermined network. As described above, the one or more leaflet $y_i$ generated by the encoding processing device 300 is diffused and distributed to storage nodes on the network. Note that the leaflet distribution unit 309 corresponds to an example of the "transmission unit".

The example of the function configuration of the encoding processing device 300 that serves as a scatter has been described above.

(b) Decoding Processing Device (Raker)

Next, an example of a function configuration of the decoding processing device 400 that serves as a raker will be described. As illustrated in FIG. 14, the decoding processing device 400 includes a leaflet collection unit 401, a collection memory 403, an observation matrix reconfiguration unit 405, and a decoding processing unit 407.

The leaflet collection unit 401 is a configuration for collecting the leaflet from each storage node on the network. As described above, the leaflet collection unit 401 calls for transmission of the leaflet by performing broadcasting (or multicasting) to each storage node on the basis of a predetermined protocol, for example, and acquires a leaflet held by the storage node from the storage node that has reacted in response to the calling. The leaflet collection unit 401 causes the collection memory 403 to store each collected leaflet. The collection memory 403 is a storage region for temporarily or permanently hold the collected leaflet. Note that the leaflet collection unit 401 corresponds to an example of the "acquisition unit".

Also, as described above, overlapping of at least a part of leaflets is permitted in the information processing system 1 according to the present embodiment, and there may be a case in which the leaflet collection unit 401 collects a leaflet that has already been collected again. Therefore, the leaflet collection unit 401 may discard the leaflet that has been collected again in a case in which the leaflet collection unit 401 collects the leaflet that is similar to the leaflet that has already been collected again. Note that it is possible to distinguish the overlapping of the leaflet on the basis of information unique to each leaflet that is associated with the leaflet, such as a leaflet generation ID, for example.

Also, the leaflet collection unit 401 provides an instruction for reconfiguring the observation matrix A based on the leaflet to the observation matrix reconfiguration unit 405 in a case in which the leaflet collection unit 401 collects the leaflet.

The observation matrix reconfiguration unit 405 reconfigures the observation matrix A used to generate the leaflet on the basis of a result of collecting the leaflet using the leaflet collection unit 401. In a specific example, the observation matrix reconfiguration unit 405 has a pseudorandom number generator (for example, a table of random numbers) that is similar to that of the encoding processing device 300 (pseudorandom number generation unit 301) and reconfigures the observation matrix A on the basis of the leaflet generation ID (random number pattern ID) associated with the leaflet. At this time, the observation matrix reconfiguration unit 405 reconfigures the observation matrix A on the basis of leaflet generation Ids associated with a plurality of leaflets in a case in which the leaflet generation Ids are information for specifying row components in the observation matrix A. Note that if row components of the observation matrix A to be reconfigured corresponding to the Y value that has been associated with the collected leaflet are reconfigured in this case, it is not necessary for the other row component be reconfigured. In addition, in a case in which the leaflet generation ID is information for specifying the observation matrix A itself, it is sufficient if the observation matrix reconfiguration unit 405 reconfigures the observation matrix A on the basis of the information in another example.

Also, in a case in which a leaflet is newly collected by the leaflet collection unit 401, the observation matrix reconfiguration unit 405 may reconfigure the observation matrix A again on the basis of a result of collecting the leaflet. In a specific example, if a leaflet is newly collected, the observation matrix reconfiguration unit 405 may reconfigure a row component corresponding to the Y value associated with the leaflet (in other words, a row configuration that has not been reconfigured at that point) among the row components of the observation matrix A reconfigured in advance.

In addition, the observation matrix reconfiguration unit 405 outputs information indicating the reconfigured observation matrix A to the decoding processing unit 407.

Note that the aforementioned processing related to the reconfiguration of the observation matrix A using the observation matrix reconfiguration unit 405 is merely an example for the decoding processing device 400 recognizing the observation matrix A used to generate the collected leaflet. That is, the method of recognizing the observation matrix A used to generate the collected leaflet is not particularly limited as long as the decoding processing device 400 can recognize the observation matrix A. In a specific example, information indicating the observation matrix A or information for reproducing the observation matrix A (for example, a table of random numbers) may be held in advance by the encoding processing device 300 and the decoding processing device 400. In addition, common information may be held between the encoding processing device 300 and the decoding processing device 400 by the encoding processing device 300 and the decoding processing device 400 transmitting and receiving information indicating the observation matrix A or information for reproducing the observation matrix A in advance on the basis of so-called encrypted communication in another example. In such a case, it is needless to say that the decoding processing device 400 may not execute the aforementioned processing related to the reconfiguration of the observation matrix A.

The decoding processing unit 407 decodes the original signal x on the basis of the leaflet held in the collection memory 403 (that is, a result of collecting the leaflet) and the observation matrix A reconfigured by the observation matrix reconfiguration unit 405. Note that the decoding processing unit 407 corresponds to an example of the "signal processing unit" in the information processing device 100 that serves as a raker.

Specifically, the decoding processing unit 407 determines whether or not it is possible to decode the original signal x on the basis of the result of collecting the leaflet first. For example, the decoding processing unit 407 determines that it is possible to decode the original signal x in a case in which the number of collected leaflets is equal to or greater than a threshold value. Then, the decoding processing unit 407 reconfigures the signal y on the basis of the Y value and the Y coordinate associated with the collected leaflet and reconfigures the original signal x on the basis of the signal y and the reconfigured observation matrix A. In a specific example, the decoding processing unit 407 decodes the original signal x by minimizing (in other words, regularizing) a predetermined cost function $J(x)$ under a restriction condition of $y=Ax$ as described above with reference to (Formula 1) to (Formula 4). In a more specific example, the decoding processing unit 407 may decode (reconfigure) the original signal x on the basis of the reconfigured signal y and the observation matrix A by solving a minimization problem of the L1 norm.

Note that Reference Literature 6: "DL. Donoho "High-dimensionalcentrally-symmetric polytopes with neighbor lines proportional to dimension," [online]. 2006, Discrete & Computational Geometry. Vol. 35. No. 4, 617. p. 15, [searched on Nov. 1, 2016], Internet <URL: https://pdfs.semanticscholar.org/c802/03f0dd27dd5c15726543b01f4c919529d4a8.pd f>", for example, discloses a background theory of determination regarding whether or not it is possible to decode (that is, reconfigure) the original signal x. Specifically, Reference Literature 6 includes consideration from a standpoint of random high-order geometry for a boundary between possibility and impossibility of complete recovery of compressed sensing. Also, Candes et al who are the authors of Reference Literature 1 described above has presented a policy that enables more accurate reconfiguration by introducing a condition of restricted isometric property. That is, a sufficient condition for enabling reconstruction of the observation matrix A generated as a random coefficient matrix is mathematically represented on the basis of the aforementioned consideration and policy in the present embodiment.

Also, although the minimization problem of the L1 norm has been described above as an example, a minimization problem of an Lp norm (p>0) is typically considered as a solution of the compressed sensing, and the minimization problem of the L1 norm corresponds to an exemplary case defined on the assumption of p=1. Note that an example of indexes in a case in which the minimization problem of the L1 norm (p=1) is solved is disclosed in Reference Literature 7: "Y, Kabashima and two others, "A typical reconstruction limit for compressed sensing," [online], 2009, Journalof-StatisticalMechanics; TheoryandExperiments, 109003, p. 6 to 7, [searched on Nov. 1, 2016], Internet <URL: http://iopscienceiop.org/article/10.1088/1742-5468/2009/09/L09003/pdf>.

Note that it is sufficient that the information indicating a reference for determining whether or not the decoding processing unit 407 can decode the signal y on the basis of the result of collecting the leaflet is held in a storage region to which the decoding processing unit 407 can refer, for example. In a specific example, information representing, in a table, threshold values indicating a boundary as to whether the signal y can be decoded or not may be used as the aforementioned information indicating the reference on the basis of the content disclosed in the aforementioned literatures. Also, the aforementioned information indicating the reference may be generated on the basis of previous experiments or the like in another example.

Note that the aforementioned various literatures mainly discuss possibility of complete recovery. Meanwhile, there may be a case in which a relatively high peak signal-to-noise ratio (PSNR) is sufficient depending on a situation even if a part of data such as image data is not completely recovered, for example, and whether or not to follow a mathematic model may depend on data to be handled. In a specific example, it is sufficiently possible to reconfigure image data, such as a natural image, at a relatively high PSNR even if the image data is not completely recovered when the compression ratio (that is, the number of samples/the total number of pieces of data or the number of leaflets/the total number of pieces of data) is about 40% according to experiences. Therefore, it is sufficient to define the observation matrix A (for example, a random matrix) of $M \times N = 0.4N \times N$ on the assumption of the number of samples $M=0.4N$ that is the total number of signal elements of the signal y (observation value) with respect to the signal length N (the total number of pixels in the image data, for example) of the original signal x, for example, and to generate the leaflet on the basis of the observation matrix A. That is, it is sufficient that a determination condition is set using about 0.4N as a threshold value for determining whether or not it is possible to reconfigure a natural image. Also, it is sufficient that the encoding processing device 300 that serves as a scatter performs control such that the number of generated leaflets is equal to or greater than 0.4N in consideration of a network condition and the like (for example, it is sufficient to generate a leaflet on the basis of the observation matrix A of $0.5N \times N$). With such a configuration, it is possible to obtain redundancy (for example, resistance against failures of a storage node that serves as a holder, failures of a network pass to the storage node, and the like) without damaging compression properties of data.

Note that in the following description, the original signal x to be decoded (reconfigured) from the leaflet will also be referred to as a "signal x'" in a case in which the original signal x is explicitly distinguished from the original signal x that serves as a generation source of the leaflet in view of the aforementioned circumstances.

The example of the function configuration of the information processing system 1 according to the present embodiment has been described above by paying attention to the encoding processing device 300 that serves as a scatter and the decoding processing device 400 that serves as a raker, in particular, with reference to FIG. 14.

<2.8. Processing>

Next, an example of a flow of a series of processing performed by the information processing system 1 according to the present embodiment will be described by paying attention to the encoding processing device 300 that serves as a scatter and the decoding processing device 400 that serves as a raker, in particular.

(a) Encoding Processing Device (Scatter)

Figure 15:
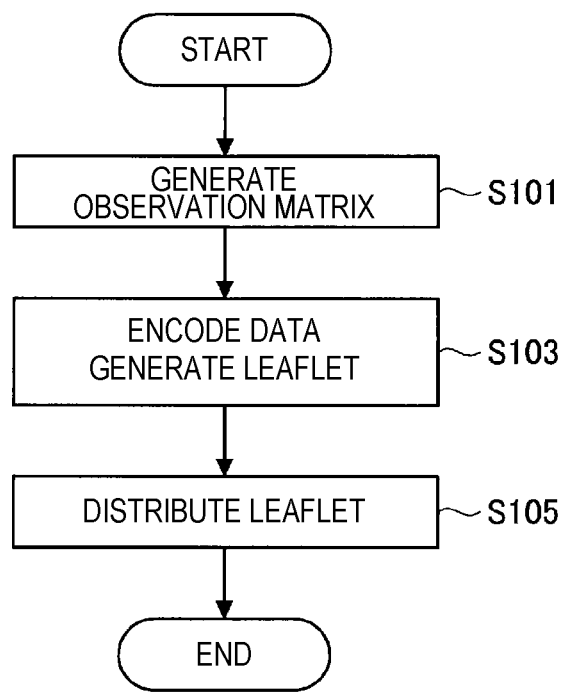
FIG. 15 is a flowchart illustrating an example of a flow of a series of processing of an encoding processing device according to the present embodiment.

First, an example of a flow of a series of processing performed by the encoding processing device 300 that serves as a scatter will be described by paying attention to processing related to generation and distribution of a leaflet, in particular, with reference to FIG. 15. FIG. 15 is a flowchart illustrating an example of a flow of a series of processing of an encoding processing device according to the present embodiment.

As illustrated in FIG. 15, the encoding processing device 300 (observation matrix generation unit 303) generates the observation matrix A on the basis of a pseudorandom number that can be reproduced on the basis of a condition decided in advance (S101).

Then, the encoding processing device 300 (encoding processing unit 305) generates the signal y after the encoding processing by encoding the sparse original signal x input as a signal as a target of encoding on the basis of the observation matrix A generated on the basis of the pseudorandom number. In addition, the encoding processing device 300 (leaflet generation unit 307) generates a leaflet $y_i$ by associating information (Y coordinate) indicating the position of each signal element (Y value) of the generate signal y in the signal y with the signal element. Note that the encoding processing device 300 may associate information such as a leaflet generation ID, a node identifier, and a system option with the generated leaflet $y_i$ at this time.

Then, the encoding processing device 300 (leaflet distribution unit 309) distributes the generated one or more leaflet $y_i$ to another storage node (the holding device 500, for example) that serves as a holder via a predetermined network (S105). As described above, the one or more leaflet $y_i$ generated by the encoding processing device 300 is diffused and distributed to storage nodes on the network.

The example of the flow of the series of processing performed by the encoding processing device 300 that serves as a scatter has been described above by paying attention to processing related to generation and distribution of the leaflet, in particular, with reference to FIG. 15.

(b) Decoding Processing Device (Raker)

Figure 16:
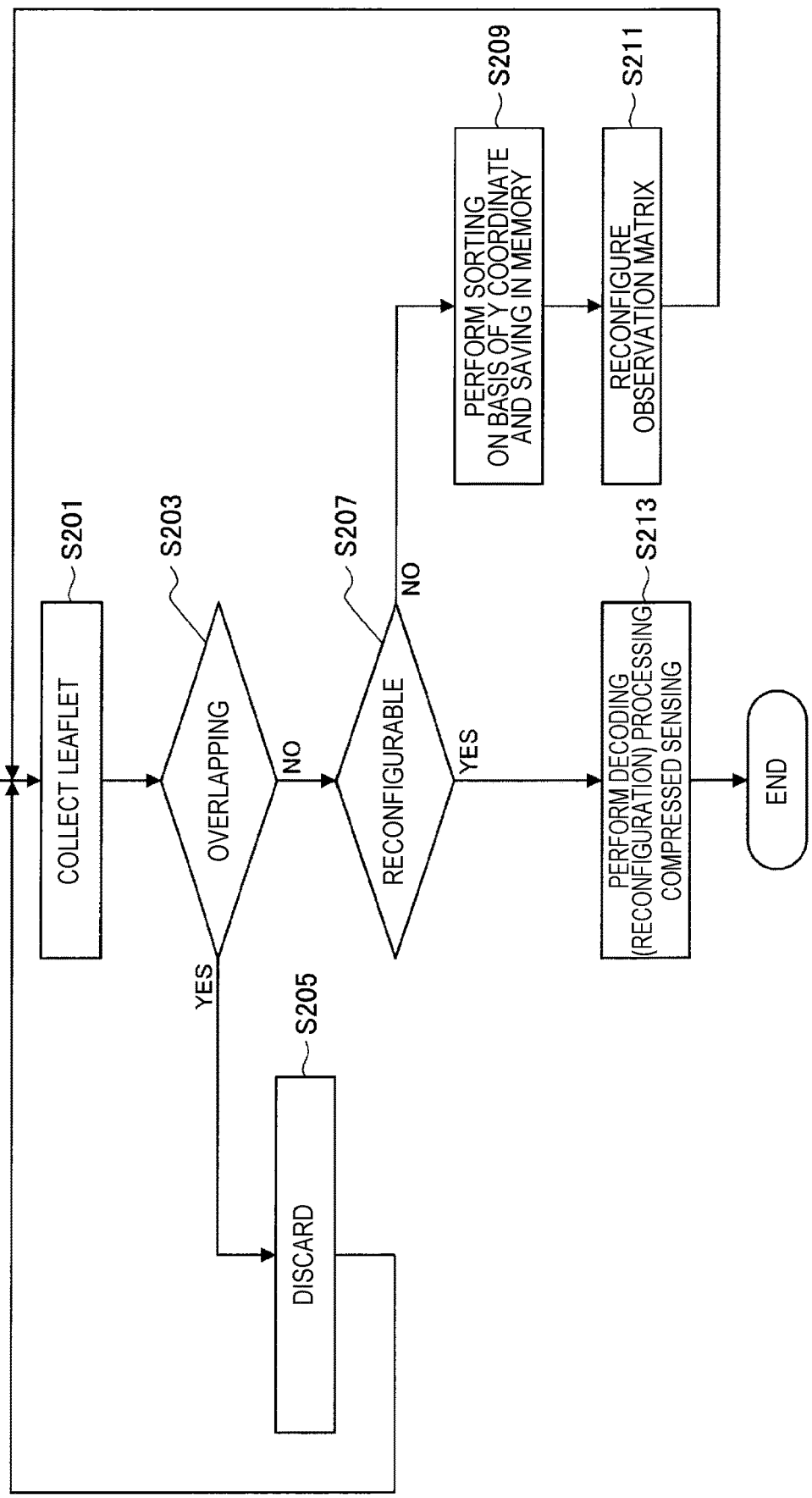
FIG. 16 is a flowchart illustrating an example of a flow of a series of processing of a decoding processing device according to the present embodiment.

Next, an example of a flow of a series of processing performed by the decoding processing device 400 that serves as a raker will be described by paying attention to collection of the leaflet and decoding (reconfiguration) of the original signal x, in particular, with reference to FIG. 16. FIG. 16 is a flowchart illustrating an example of a flow of a series of processing performed by the decoding processing device according to the present embodiment.

As illustrated in FIG. 16, the decoding processing device 400 (leaflet collection unit 401) calls for transmission of the leaflet by performing broadcasting (or multicasting) to each storage node on the network, for example, and acquires a leaflet held by the storage node from the storage node that has reacted in response to the calling (S201).

At this time, the decoding processing device 400 may discard the leaflet that has been collected again (S205) in a case in which the decoding processing device 400 collects the leaflet that is similar to the leaflet that has already been collected again (S203, YES).

Meanwhile, the decoding processing device 400 (decoding processing unit 407) determines whether or not it is possible to reconfigure the signal x' (the original signal x, for example) on the basis of a series of collected leaflets in a case in which the decoding processing device 400 newly collects other leaflet that are different from the leaflet that has already been collected (S203, NO) (S207). For example, the decoding processing device 400 may determine that it is possible to reconfigure the signal x' in a case in which the number of the series of collected leaflets is equal to or greater than a threshold value.

In a case in which it is determined to be difficult to reconstruct the signal x' (S207, NO), the decoding processing device 400 (leaflet collection unit 401) causes the collection memory 403 to store the collected leaflet. At this time, the decoding processing device 400 may rearrange the series of leaflets stored in the collection memory 403 on the basis of the information indicating the Y coordinate associated with each leaflet (S209). In addition, the decoding processing device 400 (observation matrix reconfiguration unit 405) may reconfigure the observation matrix A used to generate the leaflets on the basis of the result of collecting the leaflets. In a case in which a leaflet is newly collected, for example, the decoding processing device 400 may reconfigure a row component corresponding to the Y value associated with the leaflet (in other words, a row component that has not been reconfigured at that point) among the row components of the observation matrix A (S211). In addition, the decoding processing device 400 may additionally reconfigure a row component corresponding to a Y value associated with the newly collected leaflet in the observation matrix A in a case in which the observation matrix A has already been reconfigured for a part of row components on the basis of leaflets collected before.

The decoding processing device 400 repeatedly executes the collection of the leaflet (S201), the holding of the leaflet (S209), and the reconfiguration of the observation matrix A (S211) until it is determined to be possible to reconfigure the signal x' as described above.

Then, in a case in which it is determined to be possible to reconfigure the signal x' (S207, YES), the decoding processing device 400 (decoding processing unit 407) decodes (reconfigure) the signal x' on the basis of the leaflet held in the collection memory 403 and the reconfigured observation matrix A. Specifically, the decoding processing device 400 reconstructs the signal y on the basis of the Y value and the Y coordinate associated with the collected leaflet. Then, the decoding processing device 400 decodes the signal x' by minimizing a predetermined cost function J(x) (by solving the minimization problem of the Lp norm, for example) on the basis of the restricted condition of y=Ax (S213).

The example of the flow of the series of processing performed by the decoding processing device 400 that serves as a raker has been described above by paying attention to collection of the leaflet and decoding (reconfiguration) of the original signal x, in particular, with reference to FIG. 16.

3. EXAMPLE

Next, a specific example of the original signal x, the observation matrix A, and the signal y calculated through the compressed sensing on the basis of the original signal x and the observation matrix A will be described as an example of the information processing system according to the present embodiment. For example, FIG. 17 is an explanatory diagram for describing an example in which the information processing system 1 according to the present embodiment is implemented and illustrates a specific example of the original signal x, the observation matrix A, and the signal y.

Specifically, the number of signal elements of the original signal x is 16 (that is, the signal length N=16), and the number of non-zero components among the signal elements is 4 in the example illustrated in FIG. 17. Here, if the proportion of the number of the non-zero components with respect to the total number of the signal elements in the original signal x is represented as a degree of sparseness ρ, the degree of sparseness ρ of the original signal x illustrated in FIG. 17 satisfies ρ=4/16=25%. (Formula 5).

Also, the number of row components in the observation matrix A is 9 (that is, the number of times of observation M=9) in the example illustrated in FIG. 17. Here, if the proportion of the number of samples (the number of times of observation M) with respect to the total number of pieces of data in the original signal x (the number of signal elements N) is represented as a compression ratio σ, the compression ratio σ satisfies σ=M/N=9/16=56.25%.

In addition, the signal y illustrated in FIG. 17 represents an example of a signal generated on the basis of the original signal x and the observation matrix A illustrated in the drawing.

Note that Reference Literatures 6 and 7 described above disclose a relationship between the compression ratio σ and the degree of sparseness ρ, and it is possible to use the compression ratio σ and the degree of sparseness ρ as indexes for determining whether or not it is possible to reconfigure the original signal x. That is, the present disclosure proposes a technology for generating a series of leaflets on the basis of the signal y by generating the signal y and reconfiguring the signal x' (the original signal x, for example) on the basis of at least a part of the series of leaflets in accordance with the principle.

Note that in the example illustrated in FIG. 17, it is possible to completely reconfigure the original signal x by solving the minimization problem of the L1 norm, for example. That is, FIG. 17 illustrates an example in which it is possible to completely reconfigure the sparse original signal x on the basis of nine simultaneous linear indeterminate equations, for example, without requiring that the number of equations is equal to the signal length (N=16) of the original signal x.

The specific example of the original signal x, the observation matrix A, and the signal y calculated through the compressed sensing on the basis of the original signal x and the observation matrix A has been described above with reference to FIG. 17 as an example of the information processing system according to the present embodiment.

4. MODIFICATION EXAMPLES

Next, modification examples of the information processing system according to the present embodiment will be described.

4.1. First Modification Example: Example of Condition for Determining Whether or not it is Possible to Reconstruct Original Signal First, an example of a condition for determining whether or not a node that serves as a raker (the decoding processing device 400, for example) can reconfigure the original signal x on the basis of a result of collecting leaflets will be described as a first modification example.

For example, Candes et al who are the authors of Reference Literature 1 as described above has proposed a condition represented below as (Formula 5) as a sufficient condition for completely recovering the original signal x.

$$o(S \log(m/S)) < p \qquad \text{(Formula 5)}$$

In (Formula 5) described above, p represents the number of rows in the observation matrix A. Also, m represents the signal length of the original signal x, and S represents a degree of sparseness. That is, Candes et al has mathematically proved that the complete reproduction of the original signal x can be achieved at a sufficiently high probability by using the L1 minimization problem if the number of rows p in the observation matrix A satisfies the condition represented above as (Formula 5).

Therefore, the node that serves as a raker may determine whether or not it is possible to reconfigure the original signal x in accordance with the result of collecting the leaflets on the basis of the condition represented above as (Formula 5), for example.

Also, the node that serves as a raker may determine whether or not it is possible to reconfigure the original signal x in accordance with the result of collecting the leaflets by using the characteristics of the compressed sensing in another example.

For example, Reference Literature 8: "OZEKI Masayuki, "Sparse modeling that can be started today, [online], Mar. 3, 2016, Adaptive System Theory Group, Graduate School of Informatics, Kyoto University, [searched on Nov. 1, 2016], Internet <URL: http://www-adsys.sys.i.kyoto-u.ac.jp/mohzeki/Presentation/lecturenote20160304.pdf>" discloses information related to characteristics of the compressed sensing. Specifically, it is typically known that the original signal is successfully estimated at a significantly high probability than that in the L1 norm minimization at the boundary at the curve that satisfies the conditions represented below as (Formula 6) to (Formula 8) when the observation matrix A is generated from gaussian distribution Φ with an average of the respective components of 0 and with distribution of 1. That is, it is known that the formulae represented as (Formula 6) to (Formula 8) are satisfied between the compression ratio σ and the degree of sparseness ρ via an intervening variable τ.

$$\alpha(\rho) = \rho + 2(1-\rho)\Phi(-\tau) \qquad \text{(Formula 6)}$$

$$\frac{\rho}{1-\rho} = 2\left(\frac{\phi(\tau)}{\tau} - \Phi(-\tau)\right) \qquad \text{(Formula 7)}$$

$$\phi(\tau) = \frac{\exp(-\tau^2/2)}{\sqrt{2\pi}}, \quad \Phi(\tau) = \int_{-\infty}^{\tau} \phi(x)dx \qquad \text{(Formula 8)}$$

Figure 18:
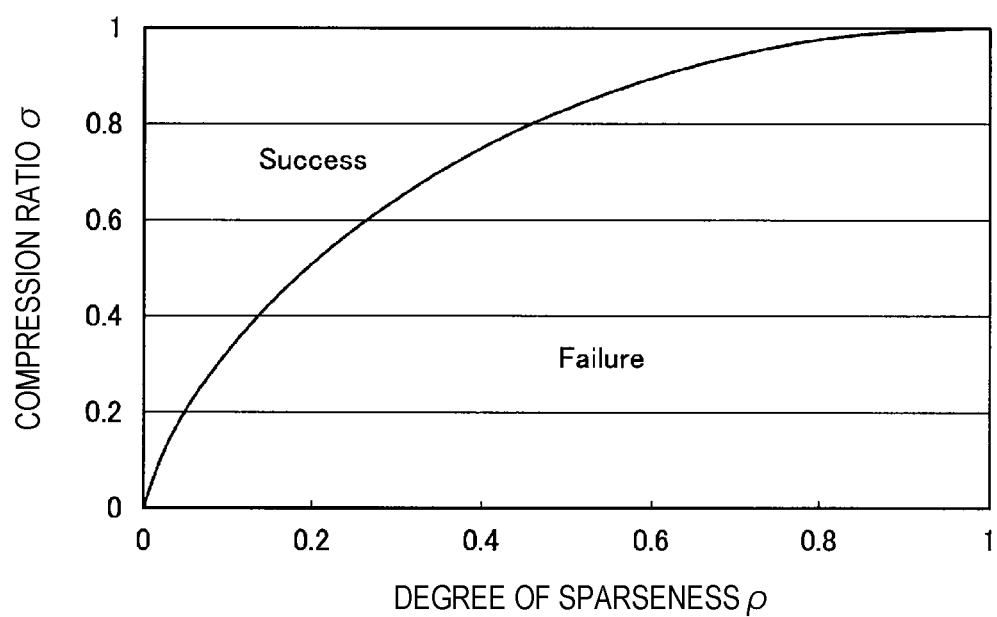
FIG. 18 is an explanatory diagram for describing an example of a determination condition for determining whether or not it is possible to reconstruct an original signal.

For example, FIG. 18 is an explanatory diagram for describing an example of a condition for determining whether or not it is possible to reconfigure the original signal x. In FIG. 18, the horizontal axis represents the degree of sparseness ρ, and the vertical axis represents the compression ratio 6. In FIG. 18, the success region located on the upper side of the curve as a boundary corresponds to a condition under which it is possible to reconfigure the original signal x. That is, in a case in which a sample Plotted in accordance with the conditions of the degree of sparseness ρ and the compression ratio σ is located in the success region, it is possible to reconfigure the original signal x at a significantly high probability. In contrast, the failure region located on the lower side of the curve as the boundary corresponds to a condition under which it is difficult to reconfigure the original signal x.

The node that serves as a raker may determine whether or not it is possible to reconfigure the original signal x in accordance with whether or not the result of collecting the leaflets satisfy the condition of being located in the success region in the graph illustrated in FIG. 18, using the aforementioned characteristics.

Note that the condition illustrated in FIG. 18 is merely an example, and the condition for determining whether or not the node that serves as a raker can reconfigure the original signal x in accordance with the result of collecting the leaflets is not necessarily limited only to the example illustrated in FIG. 18. In a specific example, an allowable PSNR condition may differ depending on the type of data as a target of the reconfiguration. In the example illustrated in FIG. 18, PSNR tends to be lower at a location that is closer to the curve even in the failure region. Therefore, the node that serves as the raker can further alleviate the condition for determining whether or not it is possible to reconfigure the original signal x as the allowable PSNR increases as compared with the example illustrated in FIG. 18, for example.

The example of the condition for determining whether or not the node that serves as a raker can reconfigure the original signal x on the basis of a result of collecting leaflets has been described above as the first modification example.

4.2. Second Modification Example: Example of System Configuration

Next, an example of a system configuration of the information processing system according to the present embodiment will be described as a second modification example.

In the aforementioned embodiment, the exemplary case in which the network storage service (the cloud storage service, for example) is provided to the terminal devices 200 by the plurality of information processing devices 100 operating as a group of a series of servers 10 has been described with reference to FIG. 1, for example. In this case, the plurality of leaflets generated from the original data by the information processing device 100 that serves as a scatter and held by a plurality of information processing devices 100 that serve as holders in a distributed manner. Also, in a case in which the data is decoded, a part of the information processing devices 100 that serves as a raker collects the leaflets from the other information processing devices 100 that serve as the holders and decode (reconfigure) the original data on the basis of the result of collecting the leaflets.

Figure 19:
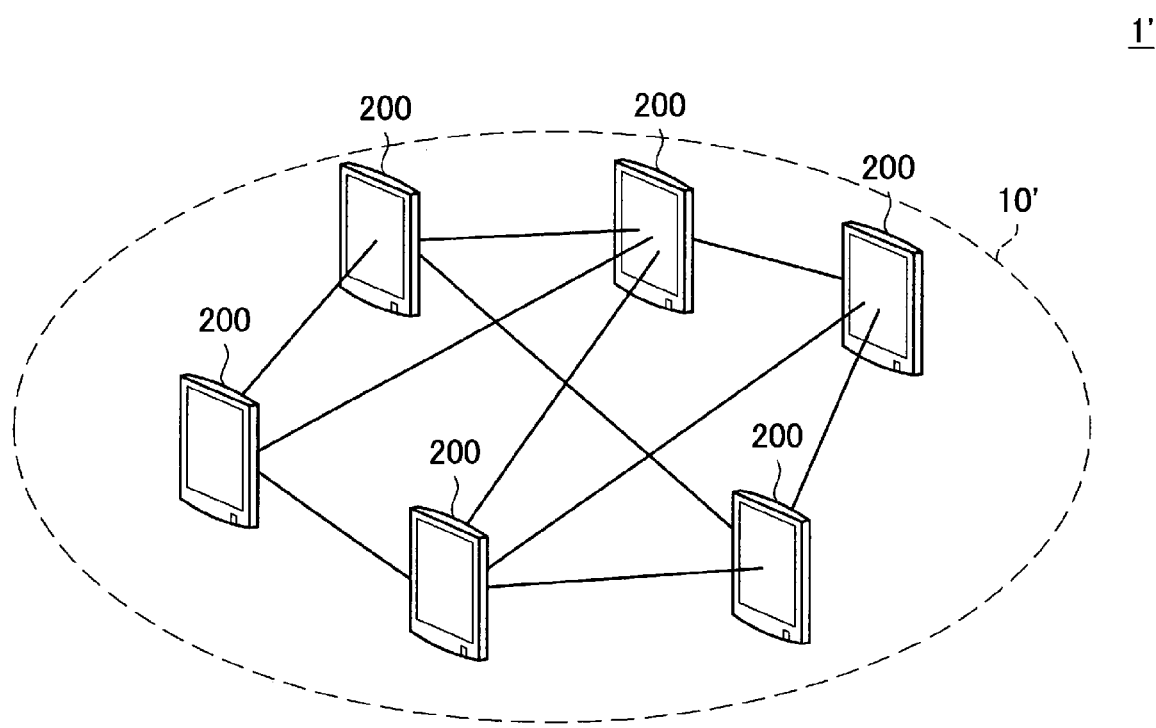
FIG. 19 is a diagram illustrating an example of a system configuration of an information processing system according to a second modification example.

Meanwhile, the type of the devices is not necessarily limited only to so-called servers such as the information processing devices 100 illustrated in FIG. 1 as long as the plurality of devices can transmit and receive information to and from each other via a network and the plurality of devices include devices that serve as scatters, holders, and rakers. For example, FIG. 19 is a diagram illustrating an example of a system configuration of the information processing system according to the second modification example. FIG. 19 illustrates an exemplary case in which the terminal devices 200 such as smartphones construct a network with other terminal devices 200 without the information processing device 100 that functions as a server. In a more specific example, a case in which the plurality of terminal devices 200 construct a so-called ad hoc network is exemplified.

In such a case, the plurality of terminal devices 200 represented with the reference numeral 10' may operate similarly to the group of the series of servers 10 described above with reference to FIG. 1. Specifically, it is sufficient if each of the plurality of terminal devices 200 connected via the network functions as at least any of the three roles, namely the "scatter", the "holder", and the "raker." With the aforementioned configuration, it is possible to cause the plurality of terminal devices 200 to hold the leaflets generated from a target data in a distributed manner and to reconstruct the original data by collecting the leaflets from the plurality of terminal devices 200 similarly to the aforementioned embodiment.

Referring to FIG. 19, the example of the system configuration of the information processing system according to the present embodiment has been described above as a second modification example.

4.3. Third Modification Example: Example of Operations of Storage Node that Serves as Scatter Next, an exemplary case in which functions of a raker are provided at a storage node (the holding device 500, for example) that serves as a scatter will be described as an example of operations of the storage node as a third modification example.

As described above, the storage node that serves both as a holder and as a scatter may distribute a distributed leaflet to other storage nodes. Meanwhile, there may be a case in which a plurality of leaflets is held by the storage node, and there may also be a situation in which it is possible to reconfigure (decode) the original signal x on the basis of the held leaflets.

Thus, at least a part of the storage node that serves both as the holder and as the scatter is provided with the functions of the raker in the information processing system according to the third modification example. Note that in this case, it is assumed that the storage node with the functions of the raker can reconfigure the observation matrix A as a generation source of the leaflet. With such a configuration, the storage node with the functions of the raker may reconfigure the original signal x on the basis of the leaflet that the storage node itself holds (that is, a distributed leaflet), regenerate the leaflet on the basis of the original signal x, and distribute the regenerated leaflet to other storage nodes.

As described above, according to the information processing system of the present embodiment, there may be a case in which it is possible to completely recover the original signal x if the result of collecting leaflets satisfies a predetermined condition even in a case in which all the leaflets generated from the original x have not been collected. The same applies to the case in which the storage provided with the functions of the raker reconfigures the original signal x.

With the aforementioned configuration, it is possible to further improve dispersion and diffusion properties of the leaflets generated from the original signal x on the basis of the observation matrix A according to the information processing system in the third modification example. Therefore, the node that serves as the raker (the decoding processing device 400, for example) can reconfigure the original signal x by interpolating the result of collecting the leaflets reproduced by other storage nodes even in a case in which it is difficult to reconfigure (decode) the original signal x merely with the leaflet generated from the original signal x in its original form. That is, according to the information processing system in the third modification example, it is possible to further enhance the possibility of the reconfiguration of the original signal x at the node that serves as the raker.

The example of the case in which the functions of the raker are provided at the storage node that serves as a scatter has been described above as an example of operations of the storage node in the third modification example.

5. HARDWARE CONFIGURATION

Figure 20:
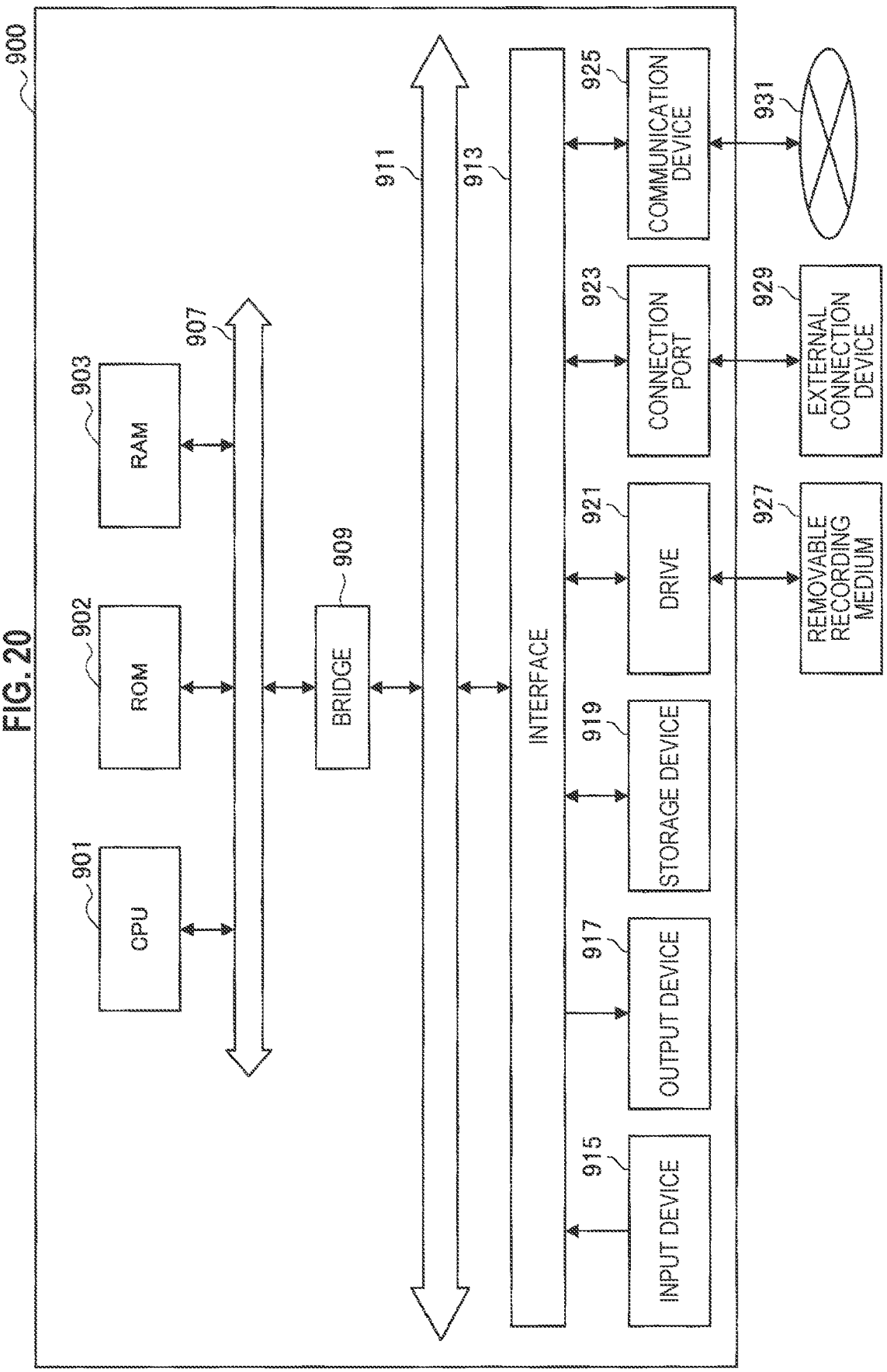
FIG. 20 is a function block diagram illustrating an example of a hardware configuration of an information processing device included in the information processing system according to the present embodiment.

Next, hardware configurations of the information processing device 100 (that is, the encoding processing device 300, the decoding processing device 400, the holding device 500, and the like) and the information processing device 900 such as the terminal device 200 that form the information processing system 1 according to the embodiment of the present disclosure will be described in detail with reference to FIG. 20. FIG. 20 is a function block diagram illustrating an example of the hardware configuration of the information processing device included in the information processing system according to the present embodiment of the present disclosure.

The information processing device 900 included in the information processing system according to the present embodiment mainly includes a CPU 901, a ROM 903, and a RAM 905. Furthermore, the information processing device 900 also includes a host bus 907, a bridge 909, an external bus 911, an interface 913, an input device 915, an output device 917, a storage device 919, a drive 921, a connection port 923, and a communication device 925.

The CPU 901 serves as an arithmetic processing device and a control device, and controls the overall operation or a part of the operation of the information processing device 900 according to various programs recorded in the ROM 903, the RAM 905, the storage device 919, or a removable recording medium 927. The ROM 903 stores programs, operation parameters, and the like used by the CPU 901. The RAM 905 primarily stores programs that the CPU 901 uses and parameters and the like varying as appropriate during the execution of the programs. These are connected with each other via the host bus 907 including an internal bus such as a CPU bus or the like. Note that the pseudorandom number generation unit 301, the observation matrix generation unit 303, the encoding processing unit 305, and the leaflet generation unit 307 described above with reference to FIG. 14 and the observation matrix reconfiguration unit 405 and the decoding processing unit 407 may be realized by a CPU 901, for example.

The host bus 907 is connected to the external bus 911 such as a peripheral component interconnect/interface) (PCI) bus via the bridge 909. Additionally, the input device 915, the output device 917, the storage device 919, the drive 921, the connection port 923, and the communication device 925 are connected to the external bus 911 via the interface 913.

The input device 915 is an operation mechanism operated by a user, such as a mouse, a keyboard, a touch panel, buttons, a switch, a lever, or a pedal. Also, the input device 915 may be a remote control mechanism (a so-called remote control) using, for example, infrared light or other radio waves, or may be an external connection device 929 such as a mobile phone or a PDA conforming to the operation of the information processing device 900. Furthermore, the input device 915 generates an input signal based on, for example, information which is input by a user with the above operation mechanism, and includes an input control circuit for outputting the input signal to the CPU 901. The user of the information processing device 900 can input various data to the information processing device 900 and can instruct the information processing device 900 to perform processing by operating the input device 915.

The output device 917 includes a device capable of visually or audibly notifying acquired information to a user. Examples of such device include display devices such as a CRT display device, a liquid crystal display device, a plasma display device, an EL display device and lamps, audio output devices such as a speaker and a headphone, a printer, and the like. For example, the output device 917 outputs a result obtained by various processes performed by the information processing device 900. More specifically, the display device displays, in the form of texts or images, a result obtained by various processes performed by the information processing device 900. On the other hand, the audio output device converts an audio signal including reproduced audio data and sound data into an analog signal, and outputs the analog signal.

The storage device 919 is a device for storing data configured as an example of a storage unit of the information processing device 900. The storage device 919 is configured from, for example, a magnetic storage device such as a hard disk drive (HDD), a semiconductor storage device, an optical storage device, or a magneto-optical storage device. This storage device 919 stores programs to be executed by the CPU 901, and various data. Note that the collection memory 403 described above with reference to FIG. 14 can be realized by the storage device 919, for example.

The drive 921 is a reader/writer for recording medium, and is embedded in the information processing device 900 or attached externally thereto. The drive 921 reads information recorded in the attached removable recording medium 927 such as a magnetic disk, an optical disc, a magneto-optical disk, or a semiconductor memory, and outputs the read information to the RAM 905. Furthermore, the drive 921 can write record in the attached removable recording medium 927 such as a magnetic disk, an optical disc, a magneto-optical disk, or a semiconductor memory. The removable recording medium 927 is, for example, a DVD medium, an HD-DVD medium, or a Blu-ray (a registered trademark) medium. In addition, the removable recording medium 927 may be a CompactFlash (CF; a registered trademark), a flash memory, a secure digital (SD) memory card, or the like. Alternatively, the removable recording medium 927 may be, for example, an integrated circuit (IC) card equipped with a non-contact IC chip or an electronic appliance.

The connection port 923 is a port for allowing devices to directly connect to the information processing device 900. Examples of the connection port 923 include a universal serial bus (USB) port, an IEEE1394 port, a small computer system interface (SCSI) port, and the like. Other examples of the connection port 923 include an RS-232C port, an optical audio terminal, a high-definition multimedia interface (HDMI) (a registered trademark) port, and the like. By the external connection device 929 connecting to this connection port 923, the information processing device 900 directly obtains various types of data from the external connection device 929 and provides various types of data to the external connection device 929.

The communication device 925 is a communication interface including, for example, a communication device for connecting to a communication network 931. The communication device 925 is, for example, a wired or wireless local area network (LAN), Bluetooth (registered trademark), a communication card for WUSB (Wireless USB), or the like. Alternatively, the communication device 925 may be a router for optical communication, a router for asymmetric digital subscriber line (ADSL), a modem for various communications, or the like. This communication device 925 can transmit and receive signals and the like in accordance with a predetermined protocol such as TCP/IP on the Internet and with other communication devices, for example. The communication network 931 connected to the communication device 925 includes a network and the like, which is connected via wire or wirelessly, and may be, for example, the Internet, a home LAN, infrared communication, radio wave communication, satellite communication, or the like. Note that the leaflet distribution unit 309 and the leaflet collection unit 401 described above with reference to FIG. 14 may be realized by the storage device 919, for example.

Heretofore, an example of the hardware configuration capable of realizing the functions of the information processing device 900 included in the information processing system according to the embodiment of the present disclosure has been shown. Each of the structural elements described above may be configured using a general-purpose material, or may be implemented by hardware dedicated to the function of each structural element. Accordingly, the hardware configuration to be used can be changed as appropriate according to the technical level at the time of carrying out the present embodiment. Note that, although not shown in FIG. 20, for example, it naturally includes various configurations corresponding to the information processing device 900 included in the information processing system according to the present embodiment.

Note that it is also possible to develop a computer program for realizing the respective functions of the information processing device 900 included in the information processing system according to the present embodiment as discussed above, and implement the computer program in a personal computer or the like. In addition, a computer-readable recording medium storing such a computer program may also be provided. The recording medium may be a magnetic disk, an optical disc, a magneto-optical disk, or flash memory, for example. Furthermore, the above computer program may also be delivered via a network, for example, without using a recording medium. In addition, the number of computers causing the computer program to be executed is not particularly limited. For example, the computer program may be executed in cooperation of a plurality of computers (e.g., a plurality of servers or the like). Note that a single computer or a plurality of cooperating computers is also referred to as "computer system."

6. CONCLUSION

As described above, the information processing system according to the present embodiment includes a plurality of nodes (the information processing devices 100, for example) connected via a network, and each of the plurality of nodes serves as at least any of the three roles, namely the "scatter", the "holder", and the "raker". With such a configuration, the node that serves as a scatter (the encoding processing device 300, for example) generates the signal y having a shorter signal length than that of the original signal x by encoding the sparse original signal x including one or more non-zero components based on original data and one or more zero components on the basis of the observation matrix A generated in accordance with the predetermined condition. Also, the node that serves as a scatter generates the one or more leaflets $y_i$ by associating information (Y coordinate) indicating the position of each signal element (Y value) of the signal y in the signal y with the signal element. Then, the node that serves as a scatter transmits the one or more generated leaflets $y_i$ to other one or mode nodes (that is, the storage nodes that serve as holders) connected via a network. Here, the original data corresponds to an example of the "first data", and the original x corresponds to an example of the "first signal". Also, the signal y corresponds to an example of the "second signal", and the leaflet $y_i$ corresponds to an example of the "second data".

In addition, the node that serves as a raker (the decoding processing device 400, for example) acquires one or mode leaflet $y_i$ from the one or more nodes (that is, the storage nodes that serves as holders) connected via the network. Then, the node that decodes the original data on the basis of the one or more acquired leaflet $y_i$ and the restriction condition in accordance with at least the row component corresponding to the signal element (Y value) associated with the leaflet $y_i$ among the row components in the observation matrix A. Note that the node that serves as a raker does not need to collect all the leaflets $y_i$ generated by encoding the original data and can reconfigure the original data from only a part of the leaflets as long as the predetermined condition is satisfied as described above.

With the aforementioned configuration, the node that serves as a distribution source of the leaflet $y_i$ does not need to recognize which of the distribution destinations (storage nodes) each leaflet $y_i$ is present at according to the information processing system in the present embodiment. Also, each storage node can independently operate without depending on states of other devices. In addition, since information (random number) for encoding that is used to generate the leaflet $y_i$ is needed to reconfigure the original signal x (and thus the original data) from the leaflet $y_i$, and it is difficult to reconfigure the original signal x only from the leaflet $y_i$, it is possible to secure confidentiality of the information. Also, since it is not necessary that all the storage nodes to which the leaflets have been distributed are operating when the original signal x (and thus the original data) is reconfigured, it is possible to independently maintain the individual storage nodes without depending on other storage nodes. That is, according to the information processing system in the present embodiment, it is possible to achieve both continuity of running of the system and reduction of running cost in a more preferred mode in a situation in which a storage region on a network (that is, a storage node) is used as a saving destination of various kinds of data.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Note that the information processing system according to the embodiment can be applied not only to images but also to various kinds of data as long as conditions of the degree of sparseness and the compression ratio are satisfied as described above. In a specific example, data obtained by forming character information or the like as an image, such as data for a facsimile or data used to typical codec such as acoustic (sound, music, and the like) data have relatively high redundancy, and a correlation between data is also relatively high. Therefore, there is a trend that it becomes easier to reproduce (recover) the data by performing minimization on the basis of a cost function using a total varians as in the information processing system according to the present embodiment.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An information processing device including:

a signal processing unit that encodes a first signal including one or more non-zero components based on first data and one or more zero components into a second signal having a shorter signal length than a signal length of the first signal on the basis of a matrix generated in accordance with a predetermined condition;

a data generation unit that generates one or more pieces of second data by associating information indicating positions of signal elements in the second signal with the signal elements in the second signal; and a transmission unit that transmits each of the one or more generated pieces of second data to one or more devices connected via a network.

(2)

The information processing device according to (1), in which the data generation unit associates information indicating transmission sources with the second data.

(3)

The information processing device according to (1) or (2), in which the data generation unit associates identification information for specifying row components corresponding to the signal elements associated with the second data among row components of the matrix with the second data.

(4)

The information processing device according to (1) or (2), in which the data generation unit associates identification information for specifying the matrix with the second data.

(5)

The information processing device according to any one of (1) to (4), in which the signal length of the second signal is decided on the basis of the signal length of the first signal and a compression ratio in accordance with the first data.

(6)

The information processing device according to any one of (1) to (5), in which the first signal is generated on the basis of predetermined arithmetic processing using the first data as an input.

(7)

The information processing device according to any one of (1) to (6), in which the matrix is generated on the basis of a result of calculating random numbers.

(8)

The information processing device according to any one of (1) to (7), in which the data generation unit generates a plurality of the pieces of second data, and the transmission unit transmits each of the plurality of generated pieces of second data to at least any of the plurality of devices.

(9)

The information processing device according to any one of (1) to (8), in which the first data is image data.

(10)

An information processing device including:

an acquisition unit that acquires each of one or more pieces of second data, in which information indicating positions of signal elements in a second signal is associated with at least some signal elements of the signal elements in the second signal, the second signal having a shorter signal length than a signal length of a first signal and being obtained such that the first signal including one or more non-zero components based on first data and one or more zero components is encoded on the basis of a matrix generated in accordance with a predetermined condition, from one or more devices connected via a network; and a signal processing unit that decodes the first data on the basis of the one or more acquired pieces of second data and a restriction condition in accordance with row components corresponding to the signal elements associated with at least the second data among the row components of the matrix.

(11)

The information processing device according to (10), in which the acquisition unit acquires the one or more pieces of second data with which information indicating a common transmission source is associated from the one or more devices.

(12)

The information processing device according to (10) or (11), in which the signal processing unit determines whether or not the first data is able to be decoded on the basis of a coefficient based on the number of the non-zero components and the number of the zero components in the first signal, a compression ratio based on the signal length of the first signal and the signal length of the second signal, and the number of the signal elements in accordance with a result of acquiring the second data.

(13)

The information processing device according to (12), in which the signal processing unit determines whether or not the first data is able to be decoded on the basis of the coefficient, the compression ratio, the number of the signal elements in accordance with the result of acquisition, and a signal-to-noise ratio that is allowable for decoding the first data.

(14)

The information processing device according to any one of (10) to (13), in which the signal processing unit specifies row components corresponding to the signal elements associated with at least the second data in the matrix on the basis of identification information associated with the second data.

(15)

The information processing device according to any one of (10) to (13), in which the signal processing unit specifies the matrix on the basis of identification information associated with the second data.

(16)

The information processing device according to any one of (10) to (15), in which the acquisition unit acquires at least some of the plurality of pieces of second data from each of the plurality of devices connected via the network.

(17)

An information processing method including:

encoding, by a computer, a first signal including one or more non-zero components based on first data and one or more zero components to a second signal having a shorter signal length than a signal length of the first signal on the basis of a matrix generated in accordance with a predetermined condition; and transmitting, by the computer, each of one or more pieces of second data, in which information indicating positions of signal elements in the second signal is associated with the signal elements in the second signal, to one or more devices connected via a network.

(18)

An information processing method including:

acquiring, by a computer, each of one or more pieces of second data, in which information indicating positions of signal elements in a second signal is associated with at least some signal elements of the signal elements in the second signal, the second signal having a shorter signal length than a signal length of a first signal and being obtained such that the first signal including one or more non-zero components based on first data and one or more zero components is encoded on the basis of a matrix generated in accordance with a predetermined condition, from one or more devices connected via a network; and decoding, by the computer, the first data on the basis of the one or more acquired pieces of second data and a restriction condition in accordance with the matrix.

(19)

A recording medium with a program recorded therein, the program including:

causing a computer to encode a first signal including one or more non-zero components based on first data and one or more zero components into a second signal having a shorter signal length than a signal length of the first signal on the basis of a matrix generated in accordance with a predetermined condition; and causing the computer to transmit each of one or more pieces of second data, in which information indicating positions of signal elements in the second signal is associated with the signal elements in the second signal, to one or more devices connected via a network.

(20)

A recording medium with a program recorded therein, the program including:

causing a computer to acquire each of one or more pieces of second data, in which information indicating positions of signal elements in a second signal is associated with at least some signal elements of the signal elements in the second signal, the second signal having a shorter signal length than a signal length of a first signal and being obtained such that the first signal including one or more non-zero components based on first data and one or more zero components is encoded on the basis of a matrix generated in accordance with a predetermined condition, from one or more devices connected via a network; and causing the computer to decode the first data on the basis of the one or more acquired pieces of second data and a restriction condition in accordance with the matrix.

REFERENCE SIGNS LIST 1 information processing system
100 information processing device
200 terminal device
250 imaging unit
300 encoding processing device
301 pseudorandom number generation unit
303 observation matrix generation unit
305 encoding processing unit
307 leaflet generation unit
309 leaflet distribution unit
400 decoding processing device
401 leaflet collection unit
403 collection memory
405 observation matrix reconfiguration unit
407 decoding processing unit
500 holding device

The invention claimed is:

1. An information processing device comprising:
a signal processing unit that encodes a first signal including one or more non-zero components based on first data and one or more zero components into a second signal having a shorter signal length than a signal length of the first signal on a basis of a matrix generated in accordance with a predetermined condition, wherein the matrix is generated on a basis of a result of calculating random numbers;
a data generation unit that generates pieces of second data by associating information indicating positions of signal elements in the second signal with the signal elements in the second signal; and
a transmission unit that transmits each of the generated pieces of second data to respective holding devices connected via a network.

2. The information processing device according to claim 1, wherein the data generation unit associates information indicating transmission sources with the pieces of second data.

3. The information processing device according to claim 1, wherein the data generation unit associates identification information for specifying row components corresponding to the signal elements associated with the pieces of second data among row components of the matrix with the pieces of second data.

4. The information processing device according to claim 1, wherein the data generation unit associates identification information for specifying the matrix with the pieces of second data.

5. The information processing device according to claim 1, wherein the signal length of the second signal is decided on a basis of the signal length of the first signal and a compression ratio in accordance with the first data.

6. The information processing device according to claim 1, wherein the first signal is generated on a basis of predetermined arithmetic processing using the first data as an input.

7. The information processing device according to claim 1, wherein the first data is image data.

8. An information processing device comprising:
an acquisition unit that acquires each of a plurality of pieces of second data, in which information indicating positions of signal elements in a second signal is associated with at least some signal elements of the signal elements in the second signal, the second signal having a shorter signal length than a signal length of a first signal that includes one or more non-zero components based on first data and one or more zero components, the pieces of second data being encoded on a basis of a matrix generated in accordance with a predetermined condition, from respective holding devices connected via a network; and
a signal processing unit that decodes the first data on a basis of the acquired pieces of second data and a restriction condition in accordance with row components corresponding to the signal elements associated with at least the pieces of second data among the row components of the matrix, wherein the matrix is generated on a basis of a result of calculating random numbers.

9. The information processing device according to claim 8, wherein the acquisition unit acquires the pieces of second data with which information indicating a common transmission source is associated from the one or more devices.

10. The information processing device according to claim 8, wherein the signal processing unit determines whether or not the first data is able to be decoded on a basis of a coefficient based on a number of the non-zero components and a number of the zero components in the first signal, a compression ratio based on the signal length of the first signal and the signal length of the second signal, and a number of the signal elements in accordance with a result of acquiring the pieces of second data.

11. The information processing device according to claim 10, wherein the signal processing unit determines whether or not the first data is able to be decoded on a basis of the coefficient, the compression ratio, the number of the signal elements in accordance with the result of acquisition, and a signal-to-noise ratio that is allowable for decoding the first data.

12. The information processing device according to claim 8, wherein the signal processing unit specifies row components corresponding to the signal elements associated with at least the second data in the matrix on a basis of identification information associated with the pieces of second data.

13. The information processing device according to claim 8, wherein the signal processing unit specifies the matrix on a basis of identification information associated with the pieces of second data.

14. An information processing method comprising:
encoding, by a computer, a first signal including one or more non-zero components based on first data and one or more zero components to a second signal having a shorter signal length than a signal length of the first signal on a basis of a matrix generated in accordance with a predetermined condition, wherein the matrix is generated on a basis of a result of calculating random numbers;
generating, by the computer, pieces of second data by associating information indicating positions of signal elements in the second signal with the signal elements in the second signal; and
transmitting, by the computer, each of the pieces of second data to respective holding devices connected via a network.

15. An information processing method comprising:
acquiring, by a computer, each of a plurality of pieces of second data, in which information indicating positions of signal elements in a second signal is associated with at least some signal elements of the signal elements in the second signal, the second signal having a shorter signal length than a signal length of a first signal that includes one or more non-zero components based on first data and one or more zero components, the pieces of second data being encoded on a basis of a matrix generated in accordance with a predetermined condition, from respective holding devices connected via a network; and
decoding, by the computer, the first data on a basis of the acquired pieces of second data and a restriction condition in accordance with row components corresponding to the signal elements associated with at least the pieces of second data among the row components of the matrix, wherein the matrix is generated on a basis of a result of calculating random numbers.

16. A non-transitory computer readable medium storing program code, the program code being executable to perform operations comprising:
encoding a first signal including one or more non-zero components based on first data and one or more zero components to a second signal having a shorter signal length than a signal length of the first signal on a basis of a matrix generated in accordance with a predetermined condition, wherein the matrix is generated on a basis of a result of calculating random numbers;
generating pieces of second data by associating information indicating positions of signal elements in the second signal with the signal elements in the second signal; and
transmitting each of the pieces of second data to respective holding devices connected via a network.

17. A non-transitory computer readable medium storing program code, the program code being executable by a processor to perform operations comprising:
acquiring each of a plurality of pieces of second data, in which information indicating positions of signal elements in a second signal is associated with at least some signal elements of the signal elements in the second signal, the second signal having a shorter signal length than a signal length of a first signal that includes one or more non-zero components based on first data and one or more zero components, the pieces of second data being encoded on a basis of a matrix generated in accordance with a predetermined condition, from respective holding devices connected via a network; and
decoding the first data on a basis of the acquired pieces of second data and a restriction condition in accordance with row components corresponding to the signal elements associated with at least the pieces of second data among the row components of the matrix, wherein the matrix is generated on a basis of a result of calculating random numbers.

18. The information processing device according to claim 1, wherein the predetermined condition comprises determining a ratio of a number of the non-zero components in the first signal to a total number of components in the first signal.

19. The information processing method according to claim 14, wherein the predetermined condition comprises determining a ratio of a number of the non-zero components in the first signal to a total number of components in the first signal.

20. The non-transitory computer readable medium according to claim 16, wherein the predetermined condition comprises determining a ratio of a number of the non-zero components in the first signal to a total number of components in the first signal.

* * * * *